(12) United States Patent
Song et al.

(10) Patent No.: US 12,087,882 B2
(45) Date of Patent: Sep. 10, 2024

(54) DISPLAY DEVICE

(71) Applicant: Samsung Display Co., LTD., Yongin-si (KR)

(72) Inventors: Myeong Hun Song, Pyeongtaek-si (KR); Jong Hwan Cha, Suwon-si (KR); Ki Nyeng Kang, Sejong-si (KR); Hee Jung Yoon, Incheon (KR); Sung Jin Lee, Yongin-si (KR); Jong Chan Lee, Suwon-si (KR); Tae Hee Lee, Asan-si (KR); Kyung Ah Choi, Asan-si (KR); Seung Jin Chu, Cheonan-si (KR)

(73) Assignee: SAMSUNG DISPLAY CO., LTD., Yongin-si (KR)

( * ) Notice: Subject to any disclaimer, the term of this patent is extended or adjusted under 35 U.S.C. 154(b) by 610 days.

(21) Appl. No.: 17/397,448

(22) Filed: Aug. 9, 2021

(65) Prior Publication Data

US 2022/0140194 A1  May 5, 2022

(30) Foreign Application Priority Data

Oct. 30, 2020 (KR) .......................... 10-2020-0143338

(51) Int. Cl.
*H01L 33/38* (2010.01)
*H01L 25/075* (2006.01)
(Continued)

(52) U.S. Cl.
CPC ........ *H01L 33/382* (2013.01); *H01L 25/0753* (2013.01); *H01L 27/156* (2013.01); *H01L 33/62* (2013.01)

(58) Field of Classification Search
None
See application file for complete search history.

(56) References Cited

U.S. PATENT DOCUMENTS 11,069,726 B2  7/2021  Kim et al.
2008/0197197 A1  8/2008  Simske et al.
(Continued)

FOREIGN PATENT DOCUMENTS

KR  10-2019-0095638  8/2019
KR  10-2019-0124359  11/2019
(Continued)

OTHER PUBLICATIONS

International Search Report corresponding to International Application No. PCT/KR2021/015399 dated Feb. 7, 2022.
(Continued)

*Primary Examiner* — William C Trapanese
(74) *Attorney, Agent, or Firm* — KILE PARK REED & HOUTTEMAN PLLC

(57) ABSTRACT

A display device includes a first electrode group including a plurality of electrodes, a second electrode group spaced apart from the first electrode group in the first direction and including a plurality of electrodes, light-emitting elements disposed on the electrodes spaced apart from one another in the second direction and having a shape extended in the second direction, and connection electrodes. The connection electrodes includes a first connection electrode, a second connection electrode, a third connection electrode, a fourth connection electrode, and the fifth connection electrode, the first connection electrode is spaced apart from a part of the fourth connection electrode disposed on the second electrode group in the first direction, and the second connection electrode is spaced apart from another part of the fourth connection electrode disposed on the first electrode group in the first direction.

20 Claims, 22 Drawing Sheets

(51) Int. Cl.
  *H01L 27/15*  (2006.01)
  *H01L 33/62*  (2010.01)

(56) References Cited

U.S. PATENT DOCUMENTS

| | | |
|---|---|---|
| 2008/0204373 A1 | 8/2008 | Sutton et al. |
| 2016/0362626 A1 | 12/2016 | Shaub |
| 2018/0175106 A1* | 6/2018 | Kim ........................ H01L 33/60 |
| 2019/0081261 A1 | 3/2019 | Lee et al. |
| 2020/0203321 A1 | 6/2020 | Choi et al. |
| 2021/0242380 A1 | 8/2021 | Kim et al. |
| 2021/0343761 A1 | 11/2021 | Kim et al. |

FOREIGN PATENT DOCUMENTS

| | | |
|---|---|---|
| KR | 10-2020-0006208 | 1/2020 |
| KR | 10-2020-0010701 | 1/2020 |
| KR | 10-2020-0078060 | 7/2020 |
| KR | 10-2021-0145030 | 12/2021 |

OTHER PUBLICATIONS

Written Opinion corresponding to International Application No. PCT/KR2021/015399 dated Feb. 7, 2022.

\* cited by examiner

DISPLAY DEVICE

CROSS-REFERENCE TO RELATED APPLICATION(S)

This application claims priority to and the benefit of Korean Patent Application No. 10-2020-0143338 under 35 U.S.C. § 119, filed on Oct. 30, 2020 in the Korean Intellectual Property Office (KIPO), and the entire contents of which are incorporated herein by reference.

BACKGROUND

1. Technical Field

The disclosure relates to a display device.

2. Description of the Related Art

Display devices become more and more important as multimedia technology evolves. Accordingly, a variety of types of display devices such as organic light-emitting display (OLED) devices and liquid-crystal display (LCD) devices are currently used.

Display devices are for displaying images and include a display panel such as an organic light-emitting display panel or a liquid-crystal display panel. Among them, light-emitting display panel may include light-emitting elements. For example, light-emitting diodes (LEDs) may include an organic light-emitting diode using an organic material as a luminescent material, and an inorganic light-emitting diode using an inorganic material as a luminescent material.

SUMMARY

Aspects of the disclosure provide a display device having a novel electrode structure.

It should be noted that objects of the disclosure are not limited to the above-mentioned object; and other objects of the disclosure will be apparent to those skilled in the art from the following descriptions.

According to an embodiment of the disclosure, connection electrodes in contact with one side of each of light-emitting elements may be disposed on the same layer in a display device. In such a display device, even if an electrode pattern is misaligned in a process of forming the connection electrodes disposed on the same layer, it is possible to cope with the misalignment by shifting the connection electrodes in the same direction.

It should be noted that effects of the disclosure are not limited to those described above and other effects of the disclosure will be apparent to those skilled in the art from the following descriptions.

According to an embodiment of the disclosure, a display device may comprise a first electrode group comprising a plurality of electrodes extended in a first direction and spaced apart from one another in a second direction crossing the first direction, a second electrode group spaced apart from the first electrode group in the first direction and comprising a plurality of electrodes, a plurality of light-emitting elements disposed on the plurality of electrodes of the first and second electrode groups spaced apart from one another in the second direction and having a shape extended in the second direction, and a plurality of connection electrodes disposed on at least some of the plurality of electrodes of the first and second electrode groups, electrically contacting the plurality of light-emitting elements, and spaced apart from one another in the second direction. The connection electrodes may comprise a first connection electrode disposed on one of the plurality of electrodes of the first electrode group, a second connection electrode disposed on one of the plurality of electrodes of the second electrode group, a third connection electrode disposed on one or more of the plurality of electrodes of the first electrode group, a fourth connection electrode disposed on another one of the plurality of electrodes of the first electrode group and on another one of the plurality of electrodes of the second electrode group, and a fifth connection electrode disposed on one or more of the plurality of electrodes of the second electrode group, the first connection electrode is spaced apart from a part of the fourth connection electrode on the second electrode group in the first direction, and the second connection electrode is spaced apart from another part of the fourth connection electrode disposed on the first electrode group in the first direction.

Parts of the third connection electrode disposed on the plurality of electrodes of the first electrode group may be spaced apart from parts of the fifth connection electrode disposed on the plurality of electrodes of the second electrode group in the first direction, respectively.

The first connection electrode may electrically contact the one of the plurality of electrodes of the first electrode group, and the second connection electrode may electrically contact the one of the plurality of electrodes of the second electrode group.

The first electrode group may comprise a first electrode, a second electrode spaced apart from the first electrode in the second direction, a third electrode spaced apart from the second electrode in the second direction, and a fourth electrode spaced apart from the third electrode in the second direction, the second electrode group may comprise a fifth electrode spaced apart from the first electrode in the first direction, a sixth electrode spaced apart from the second electrode in the first direction, a seventh electrode spaced apart from the third electrode in the first direction, and an eighth electrode spaced apart from the fourth electrode in the first direction, and the plurality of light-emitting elements may comprise a first light-emitting element disposed on the first electrode and the second electrode, a second light-emitting element disposed on the third electrode and the fourth electrode, a third light-emitting element disposed on the fifth electrode and the sixth electrode, and a third light-emitting element disposed on the seventh electrode and the eighth electrode.

The first connection electrode may be disposed on the first electrode, the second connection electrode may be disposed on the seventh electrode, the third connection electrode may comprise a first extended portion disposed on the second electrode, a second extended portion disposed on the fourth electrode, and a first bridge portion electrically connecting the first extended portion with the second extended portion, the fourth connection electrode may comprise a third extended portion disposed on the third electrode, a fourth extended portion disposed on the fifth electrode, and a second bridge portion electrically connecting the third extended portion with the fourth extended portion, and the fifth connection electrode may comprise a fifth extended portion disposed on the sixth electrode, a sixth extended portion disposed on the eighth electrode, and a third bridge portion electrically connecting the fifth extended portion with the sixth extended portion.

Each of the first connection electrode, the second connection electrode and the fourth connection electrode may electrically contact a first side of the plurality of light-emitting elements in the second direction, and each of the third connection electrode and the fifth connection electrode may electrically contact a second side of the plurality of light-emitting elements in the second direction.

Each of the plurality of light-emitting elements may comprise a first semiconductor layer disposed at a first end of each of the plurality of light-emitting elements, a second semiconductor layer disposed at a second end of each of the plurality of the light-emitting elements, and an emission layer between the first semiconductor layer and the second semiconductor layer, the first light-emitting element and the third light-emitting element may be oriented so that the first ends of the first and third light-emitting elements face in the second direction, and the second light-emitting element and the fourth light-emitting element may be oriented so that the first ends of the second and fourth light-emitting elements face in a direction opposite to the second direction.

The second bridge portion and the third bridge portion may be spaced apart from each other in a first separation portion between the first electrode group and the second electrode group, and the first bridge portion may be spaced apart from the first separation portion in the first direction.

The first connection electrode may be disposed on the second electrode, the second connection electrode may be disposed on the eighth electrode, the third connection electrode may comprise a first extended portion disposed on the first electrode, a second extended portion disposed on the third electrode, and a first bridge portion electrically connecting the first extended portion with the second extended portion, the fourth connection electrode may comprise a third extended portion disposed on the fourth electrode, a fourth extended portion disposed on the sixth electrode, and a second bridge portion electrically connecting the third extended portion with the fourth extended portion, and the fifth connection electrode may comprise a fifth extended portion disposed on the fifth electrode, a sixth extended portion disposed on the seventh electrode, and a third bridge portion electrically connecting the fifth extended portion with the sixth extended portion.

Each of the first connection electrode, the second connection electrode, and the fourth connection electrode may electrically contact a second side of the plurality of light-emitting elements in the second direction, and each of the third connection electrode and the fifth connection electrode may electrically contact a first side of the plurality of light-emitting elements in the second direction.

Each of the plurality of light-emitting elements may comprise a first semiconductor layer disposed at a first end of each of the plurality of light-emitting elements, a second semiconductor layer disposed at a second end of each of the plurality of light-emitting elements, and an emission layer disposed between the first semiconductor layer and the second semiconductor layer, the first light-emitting element and the third light-emitting element may be oriented so that the first ends of the first and third light-emitting elements face in a direction opposite to the second direction, and the second light-emitting element and the fourth light-emitting element may be oriented so that the first ends of the second and fourth light-emitting elements face in the second direction.

The first bridge portion and the second bridge portion may be spaced apart from each other in a first separation portion between the first electrode group and the second electrode group, and the third bridge portion may be spaced apart from the first separation portion in the first direction.

The display device may further comprise a first insulating layer disposed on the plurality of electrodes of the first and second electrode groups, a second insulating layer disposed on the plurality of light-emitting elements and exposing a first side and a second side of each of the plurality of light-emitting elements in the second direction, and a third insulating layer disposed on the second insulating layer and exposing the first side of each of the plurality of light-emitting elements. The plurality of light-emitting elements may be disposed between the first insulating layer and the second insulating layer.

The first connection electrode, the second connection electrode, and the fourth connection electrode may be disposed on the third insulating layer and electrically contact the first side of each of the plurality of light-emitting elements, the third connection electrode and the fifth connection electrode may be disposed on the second insulating layer to electrically contact the second side of each of the plurality of light-emitting elements, and the third insulating layer may overlap the third connection electrode and the fifth connection electrode.

According to an embodiment of the disclosure, a display device may comprise a first electrode group comprising a plurality of electrodes including a first electrode extended in a first direction, a second electrode spaced apart from the first electrode in a second direction, a third electrode spaced apart from the second electrode in the second direction, and a fourth electrode spaced apart from the third electrode in the second direction, a second electrode group comprising a fifth electrode spaced apart from the first electrode in the first direction, the sixth electrode spaced apart from the second electrode in the first direction, a seventh electrode spaced apart from the third electrode in the first direction, and an eighth electrode spaced apart from the fourth electrode in the first direction, a plurality of light-emitting elements disposed on the plurality of electrodes spaced apart from one another in the second direction and extended in the second direction, and a plurality of connection electrodes disposed on at least some of the plurality of electrodes, electrically contacting the plurality of light-emitting elements, and spaced apart from one another in the second direction. The plurality of connection electrodes comprises a first connection electrode disposed on the first electrode, a second connection electrode disposed on the third electrode, a third connection electrode disposed on the second electrode and the sixth electrode, and a fourth connection electrode disposed on the fifth electrode and the seventh electrode, and a fifth connection electrode disposed on the fourth electrode and the eighth electrode.

Each of the first connection electrode, the second connection electrode and the fourth connection electrode may electrically contact a first side of the plurality of light-emitting elements in the second direction, and each of the third connection electrode and the fifth connection electrode may electrically contact a second side of the plurality of light-emitting elements in the second direction.

The fourth connection electrode may comprise a plurality of extended portions disposed on the fifth electrode and the seventh electrode, and a bridge portion extended in the second direction and electrically connecting the plurality of extended portions, and the extended portions may be disposed parallel to the first connection electrode and the second connection electrode in the first direction.

Each of the plurality of light-emitting elements may comprise a first semiconductor layer disposed at a first end of each of the plurality of light-emitting elements, a second semiconductor layer disposed at a second end of each of the plurality of light-emitting elements, and an emission layer disposed between the first semiconductor layer and the second semiconductor layer, and the plurality of light-emitting elements may comprise a first type light-emitting element including a first end electrically contacting the first connection electrode and a second end electrically contacting the third connection electrode, and a second type light-emitting element including a first end electrically contacting the third connection electrode and a second end electrically contacting the first connection electrode.

The display device may further comprise a first insulating layer disposed on the plurality of electrodes, a second insulating layer disposed on the plurality of light-emitting elements and exposing a first side and a second side of each of the plurality of light-emitting elements in the second direction, and a third insulating layer disposed on the second insulating layer and exposing the first side of each of the plurality of light-emitting elements in the second direction. The first connection electrode, the second connection electrode, and the fourth connection electrode may be disposed on the third insulating layer and electrically contact the first side of each of the plurality of light-emitting elements, the third connection electrode and the fifth connection electrode may be disposed on the second insulating layer and electrically contact the second side of each of the plurality of light-emitting elements, and the third insulating layer may be disposed to cover the third connection electrode and the fifth connection electrode.

The first connection electrode may electrically contact the first electrode through a first contact part penetrating through the first insulating layer, and the second connection electrode may electrically contact the third electrode through a second contact part penetrating through the first insulating layer.

BRIEF DESCRIPTION OF THE DRAWINGS

The above and other aspects and features of the disclosure will become more apparent by describing in detail exemplary embodiments thereof with reference to the attached drawings, in which.

DETAILED DESCRIPTION OF THE EMBODIMENTS

The disclosure will now be described more fully hereinafter with reference to the accompanying drawings, in which embodiments of the disclosure are shown. This disclosure may, however, be embodied in different forms and should not be construed as limited to the embodiments set forth herein. Rather, these embodiments are provided so that this disclosure will be thorough and complete, and will fully convey the scope of the disclosure to those skilled in the art.

It will also be understood that when a layer is referred to as being "on" another layer or substrate, it can be directly on the other layer or substrate, or intervening layers may also be present. The same reference numbers indicate the same components throughout the specification.

It will be understood that, although the terms "first," "second," and the like may be used herein to describe various elements, these elements should not be limited by these terms. These terms are only used to distinguish one element from another element. For instance, a first element discussed below could be termed a second element without departing from the teachings of the disclosure. Similarly, the second element could also be termed the first element.

The phrase "at least one of" is intended to include the meaning of "at least one selected from the group of" for the purpose of its meaning and interpretation. For example, "at least one of A and B" may be understood to mean "A, B, or A and B."

Unless otherwise defined or implied herein, all terms (including technical and scientific terms) used herein have the same meaning as commonly understood by those skilled in the art to which this disclosure pertains. It will be further understood that terms, such as those defined in commonly used dictionaries, should be interpreted as having a meaning that is consistent with their meaning in the context of the relevant art and the disclosure, and should not be interpreted in an ideal or excessively formal sense unless clearly so defined herein.

Hereinafter, embodiments of the disclosure will be described with reference to the accompanying drawings.

Figure 1:
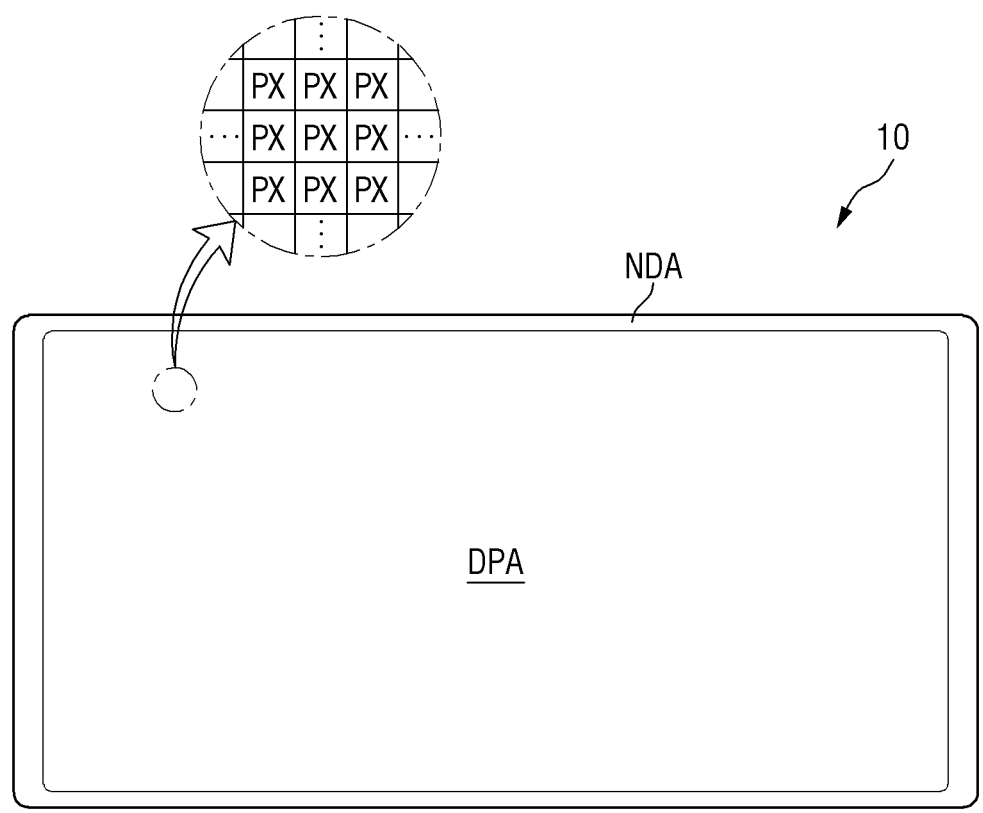
FIG. 1 is a schematic plan view of a display device according to an embodiment of the disclosure.
Figure 1:
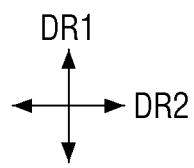

FIG. 1 is a schematic plan view of a display device according to an embodiment.

Referring to FIG. 1, the display device 10 may display a moving image or a still image. The display device 10 may refer to any electronic device that provides a display image. For example, the display device 10 may include a television, a laptop personal computer (PC), a monitor, an electronic billboard, an Internet of Things (IoT) device, a mobile phone, a smartphone, a tablet PC, an electronic watch, a smartwatch, a watchphone, a head-mounted display device, a mobile communications terminal, an electronic notebook, an electronic book, a portable multimedia player (PMP), a navigation system, a game console, a digital camera, a camcorder, or the like.

The display device 10 may include a display panel for providing a display screen. Examples of the display panel may include an inorganic light-emitting diode display panel, an organic light-emitting display panel, a quantum-dot light-emitting display panel, a plasma display panel, a field emission display panel, or the like. In the following description, an inorganic light-emitting diode display panel may be employed as an example of the display panel 10, but the disclosure is not limited thereto. Any other display panel may be employed as the display panel 10 as long as the technical idea of the disclosure may be equally applied thereto.

The shape of the display device 10 may be modified in a variety of ways. For example, the display device 10 may have one or more shapes such as a rectangle with longer lateral sides, a rectangle with longer vertical sides, a square, a quadrangle with rounded corners (vertices), other polygons, a circle, or the like. The shape of a display area DPA of the display device 10 may also be similar to the overall shape of the display device 10. In the example shown in FIG. 1, the display device 10 may have a rectangular shape with longer sides in a second direction DR2.

The display device 10 may include the display area DPA and a non-display area NDA. In the display area DPA, images may be displayed. In the non-display area NDA, no image may be displayed. The display area DPA may be referred to as an active area, while the non-display area NDA may be referred to as an inactive area. The display area DPA may generally occupy the center of the display device 10.

The display area DPA may include pixels PX. The pixels PX may be arranged in a matrix. The shape of each pixel PX may be, but is not limited to, a rectangle or a square in a plan view. Each pixel PX may have a rhombic shape having sides inclined with respect to a direction. The pixels PX may be arranged in a stripe or PenTile® pattern. Each of the pixels PX may include at least one light-emitting element that emits light of a particular wavelength band to display a color.

The non-display area NDA may be disposed around the display area DPA. The non-display area NDA may surround the display area DPA entirely or partially. The display area DPA may have a rectangular shape, and the non-display area NDA may be adjacent to the four sides of the display area DPA. The non-display area NDA may form the bezel of the display device 10. Lines or circuit drivers included in the display device 10 may be disposed in the non-display area NDA, or external devices may be mounted in the non-display area NDA.

Figure 2:
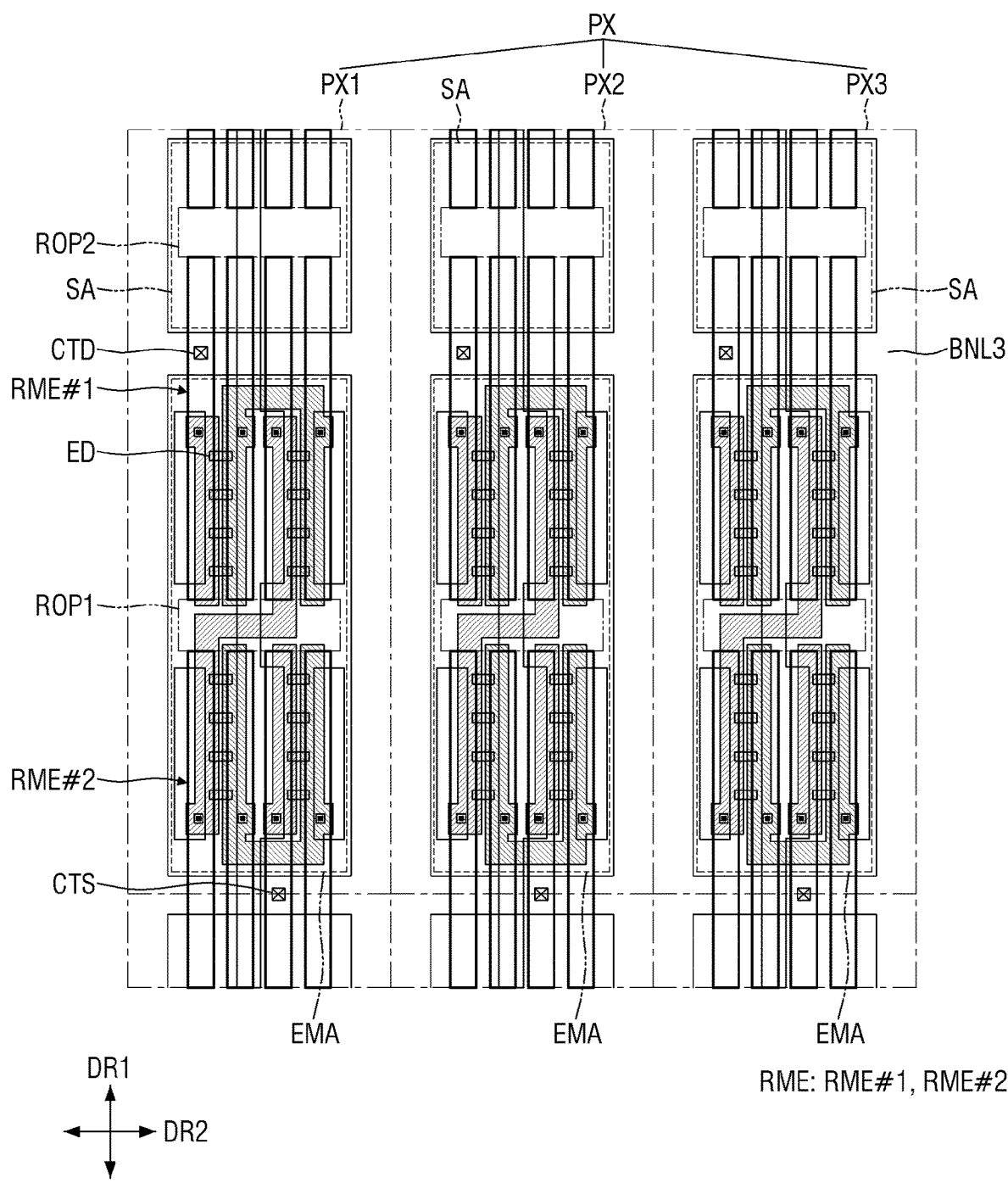
FIG. 2 is a schematic plan view showing a pixel of a display device according to an embodiment of the disclosure.

FIG. 2 is a schematic plan view illustrating a pixel of a display device according to an embodiment. FIG. 2 illustrates a pixel PX and a part of another pixel PX adjacent thereto in the first direction DR1.

Referring to FIG. 2, each of the pixels PX of the display device 10 may include sub-pixels PXn, where n is an integer from one to three. For example, a pixel PX may include a first sub-pixel PX1, a second sub-pixel PX2, and a third sub-pixel PX3. The first sub-pixel PX1 may emit light of a first color, the second sub-pixel PX2 may emit light of a second color, and the third sub-pixel PX3 may emit light of a third color. For example, the first color may be blue, the second color may be green, and the third color may be red. It is, however, to be understood that the disclosure is not limited thereto. All the sub-pixels PXn may emit light of a same color. In an embodiment, the sub-pixels PXn may emit blue light. Although a single pixel PX includes three sub-pixels PXn in the example shown in FIG. 2, the disclosure is not limited thereto. The pixel PX may include more than two sub-pixels PXn.

Each of the sub-pixels PXn of the display device 10 may include an emission area EMA and a non-emission area. In the emission area EMA, the light-emitting elements ED may emit light of a particular wavelength. In the non-emission area, the light-emitting element ED may not be disposed, and light emitted from the light-emitting elements ED do not reach the non-emission area so that no light exits therefrom. The emission area may include an area in which the light-emitting elements ED are disposed, and may include an area which is adjacent to the light-emitting elements ED and from which light emitted from the light-emitting element ED is emitted.

The disclosure is not limited thereto. The emission area EMA may also include an area in which light emitted from the light-emitting diode ED is reflected or refracted by other elements to exit. The light-emitting diodes ED may be disposed in each of the sub-pixels PXn, and the emission area may include the area where the light-emitting elements are disposed and the adjacent area.

Although the emission areas EMA of the sub-pixels PXn have substantially a uniform area in the example shown in the drawings, the disclosure is not limited thereto. In some embodiments, the emission areas EMA of the sub-pixels PXn may have different areas depending on a color or wavelength band of light emitted from the light-emitting diodes ED disposed in the respective sub-pixels PXn.

Each of the sub-pixels PXn may further include a sub-area SA disposed in the non-emission area. The sub-area SA may be disposed on a side of the emission area EMA in the first direction DR1 and may be disposed between the emission areas EMA of the sub-pixels PXn adjacent to each other in the first direction DR1. For example, the emission areas EMA and the sub-areas SA may be arranged repeatedly in the second direction DR2 and may be arranged alternately in the first direction DR1. It is, however, to be understood that the However, the disclosure is not limited thereto. The emission areas EMA and the sub-areas SA of the pixels PX may have an arrangement different from that of FIG. 2.

A third bank BNL3 may be disposed between the sub-areas SA and the emission areas EMA, and the distance between them may vary depending on the width of the third bank BNL3. The light-emitting diode ED may not be disposed in the sub-areas SA, and thus no light may exit therefrom. Some of electrodes RME disposed in the sub-pixels PXn may be disposed in the sub-areas SA. The electrodes RME disposed in different sub-pixels PXn may be disposed separately from one another in separation portions ROP of the sub-areas SA.

The third bank BNL3 may be disposed in a lattice pattern on the front surface of the display area DPA including portions extended in the first direction DR1 and the second direction DR2 in a plan view. The third bank BNL3 may be disposed along the border of each of the sub-pixels PXn to distinguish adjacent sub-pixels PXn from one another. The third bank BNL3 may surround the emission area EMA disposed in each of the sub-pixels PXn to distinguish between them.

Figure 3:
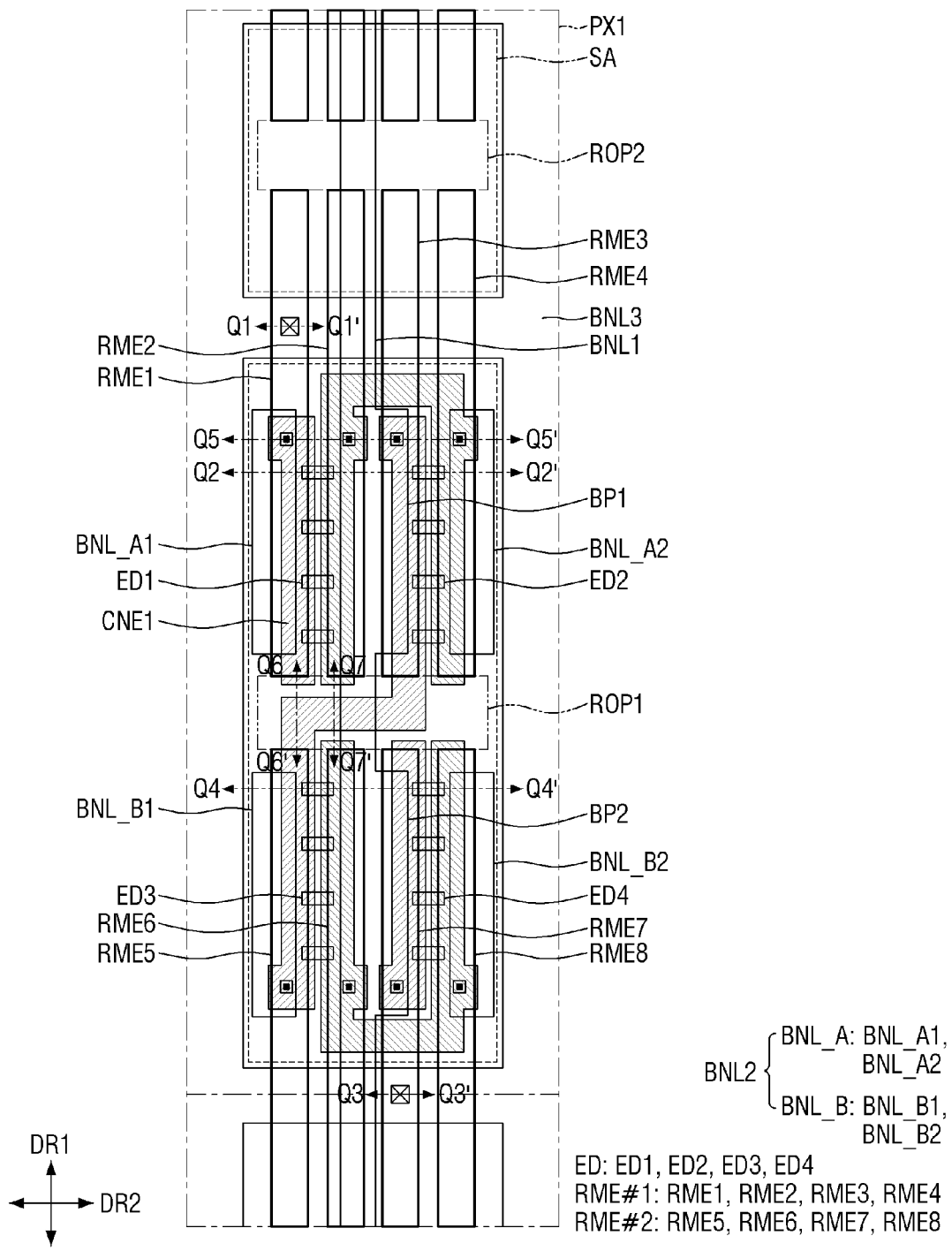
FIG. 3 is a schematic plan view showing a first sub-pixel of FIG. 2.
Figure 4:
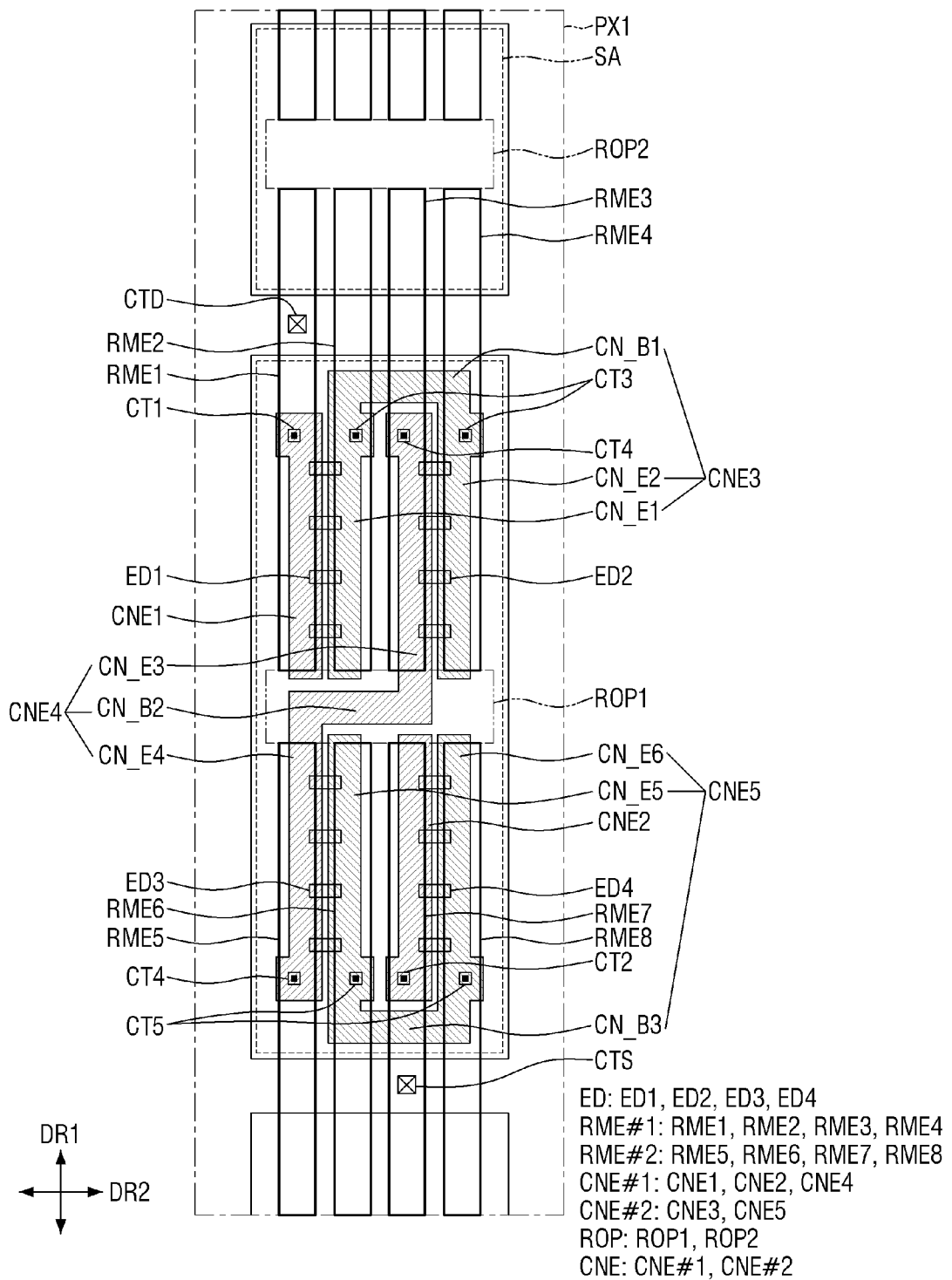
FIG. 4 is a schematic plan view showing a relative arrangement of electrodes and connection electrodes disposed in the first sub-pixel of FIG. 2.
Figure 5:
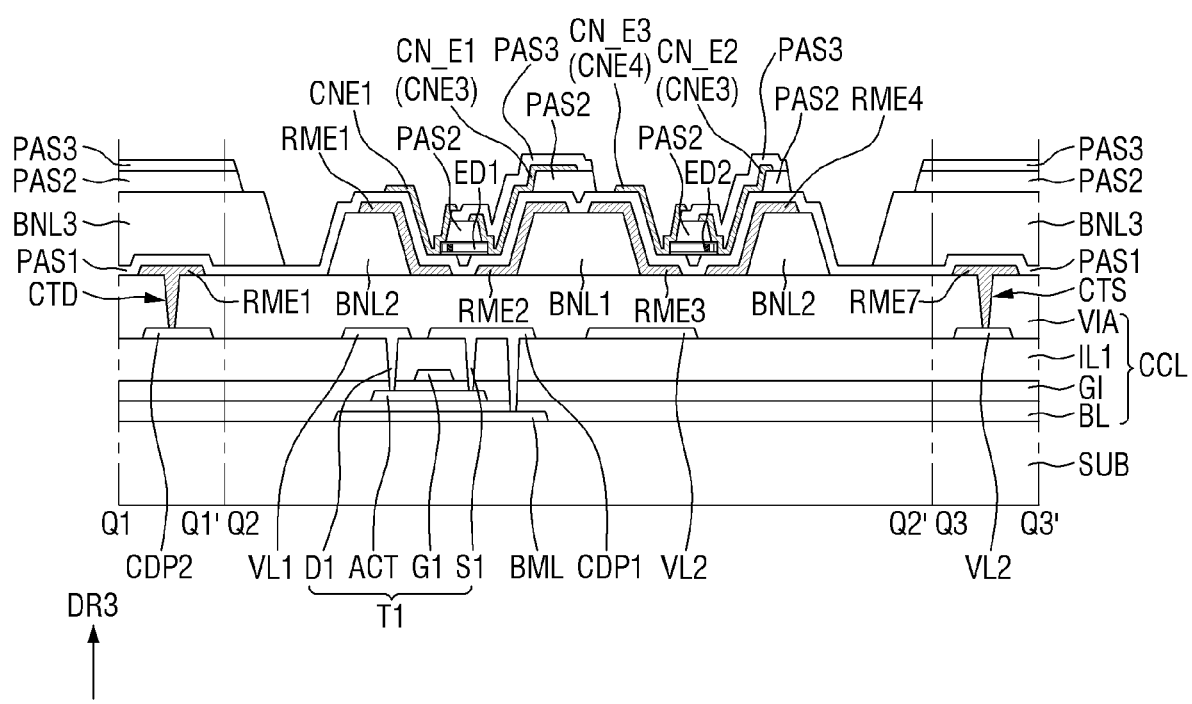
FIG. 5 is a schematic cross-sectional view taken along lines Q1-Q1', Q2-Q2' and Q3-Q3' of FIG. 3.
Figure 6:
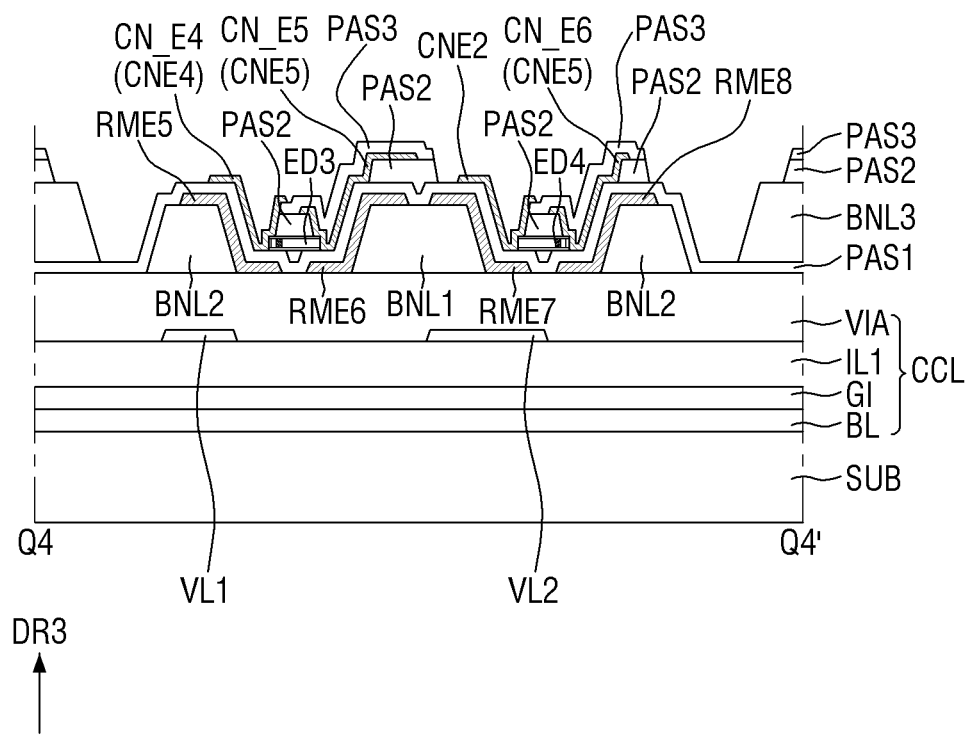
FIG. 6 is a schematic cross-sectional view taken along line Q4-Q4' of FIG. 3.
Figure 7:
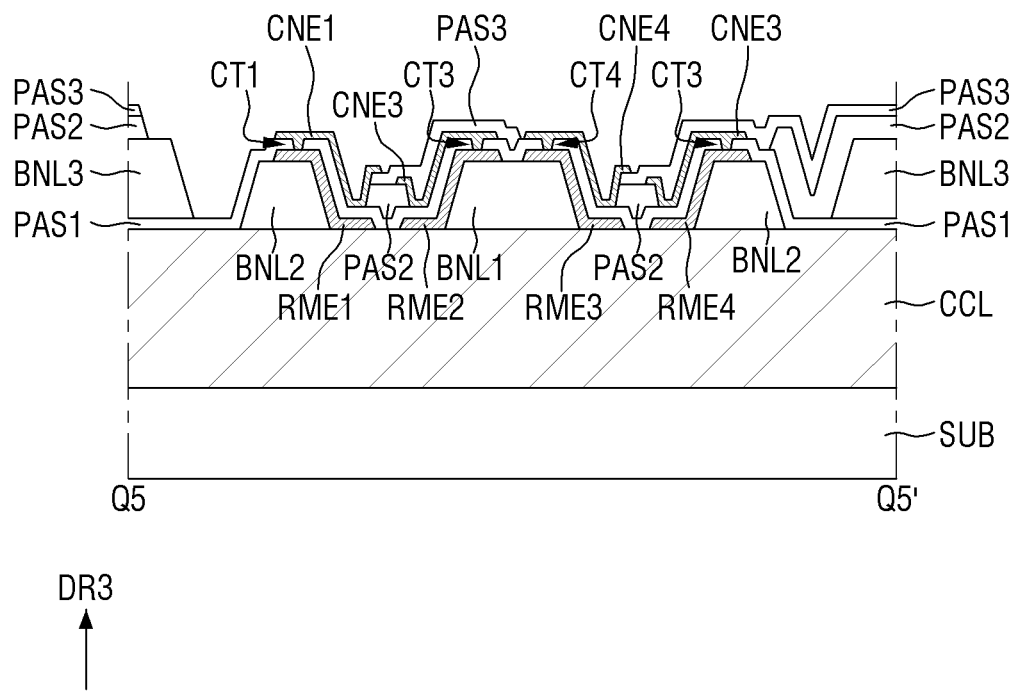
FIG. 7 is a schematic cross-sectional view taken along line Q5-Q5' of FIG. 3.
Figure 8:
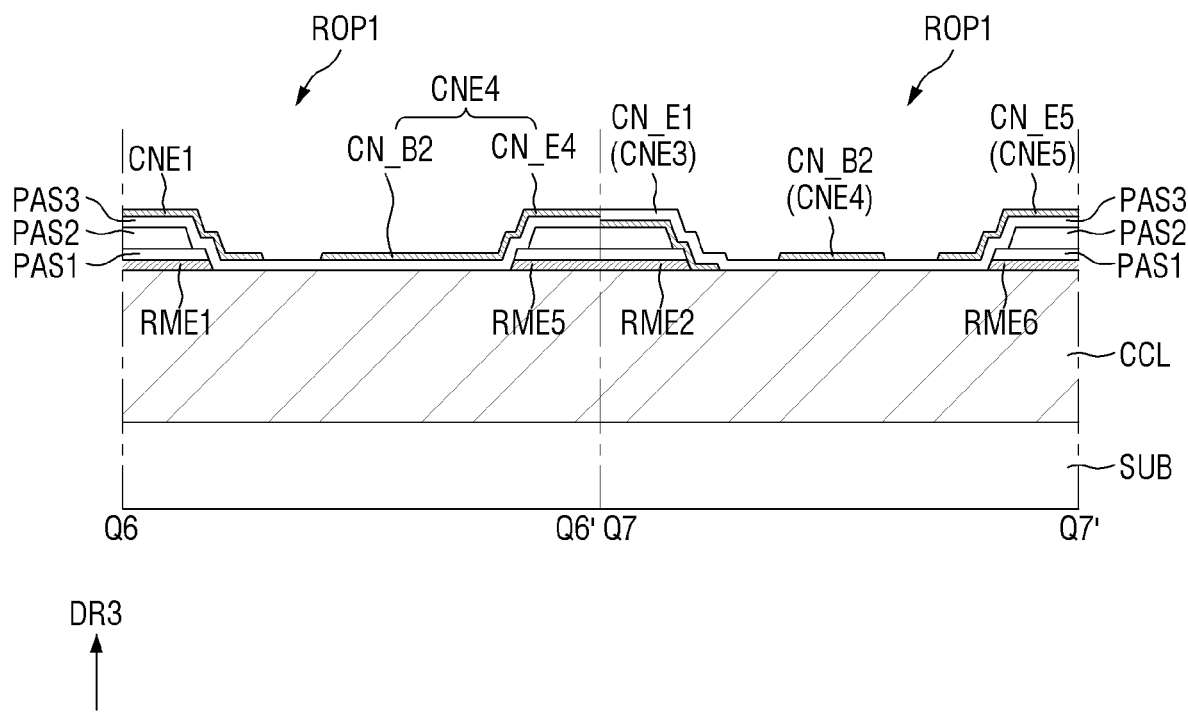
FIG. 8 is a schematic cross-sectional view taken along lines Q6-Q6' and Q7-Q7' of FIG. 3.

FIG. 3 is a schematic plan view illustrating a first sub-pixel of FIG. 2. FIG. 4 is a schematic plan view illustrating a relative arrangement of electrodes and connection electrodes disposed in the first sub-pixel of FIG. 2. FIG. 5 is a schematic cross-sectional view taken along lines Q1-Q1', Q2-Q2', and Q3-Q3' of FIG. 3. FIG. 6 is a schematic cross-sectional view taken along line Q4-Q4' of FIG. 3. FIG. 7 is a schematic cross-sectional view taken along line Q5-Q5' of FIG. 3. FIG. 8 is a schematic cross-sectional view taken along lines Q6-Q6' and Q7-Q7' of FIG. 3.

FIG. 3 illustrates a first sub-pixel PX1 included in a pixel PX, and a part of another sub-pixel PXn adjacent thereto in the first direction DR1, and FIG. 4 illustrates the arrangement of electrodes RME, light-emitting diodes ED, and connection electrodes CNE disposed in the first sub-pixel PX1. FIGS. 5 and 6 illustrate cross sections each traversing both ends of different light-emitting diodes ED (e.g., first, second, third, and fourth light-emitting diodes ED1, ED2, ED3, and ED4) disposed in the first sub-pixel PX1. FIG. 7 illustrates a cross section traversing contact parts CT1, CT2, CT3, and CT4 in the first sub-pixel PX1, and FIG. 8 illustrates a cross section of a part of a first separation portion ROP1 between different electrode groups RME #1 and RME #2.

Referring to FIGS. 2 and 3 to 8, the display device 10 may include a first substrate SUB, a semiconductor layer disposed on the first substrate SUB, conductive layers, and insulating layers. The semiconductor layer, the conductive layers, and the insulating layers may form a circuit layer CCL and a display element layer of the display device 10.

The first substrate SUB may be an insulating substrate. The first substrate SUB may be made of an insulating material such as glass, quartz, and a polymer resin. The first substrate SUB may be either a rigid substrate or a flexible substrate that may be bent, folded, or rolled.

A first conductive layer may be disposed on the first substrate SUB1. The first conductive layer may include a bottom metal layer BML. The bottom metal layer BML may overlap an active layer ACT1 of a first transistor T1. The bottom metal layer BML may include a material that blocks light and thus may prevent light from entering the active layer ACT1 of the first transistor T1. The bottom metal layer BML may be removed.

A buffer layer BL may be disposed on the bottom metal layer BML and the first substrate SUB. The buffer layer BL may be formed on the first substrate SUB to protect the transistors of the pixel PX from moisture permeating through the first substrate SUB that is susceptible to moisture permeation, and may have a surface planarization function.

The semiconductor layer may be disposed on the buffer layer BL. The semiconductor layer may include the active layer ACT1 of the first transistor T1. The active layer ACT1 may partially overlap a gate electrode G1 of a second conductive layer, which will be described below.

The semiconductor layer may include polycrystalline silicon, monocrystalline silicon, an oxide semiconductor, or the like. In other embodiments, the semiconductor layer may include polycrystalline silicon. The oxide semiconductor may be an oxide semiconductor containing indium (In). For example, the oxide semiconductor may be at least one of indium tin oxide (ITO), indium zinc oxide (IZO), indium gallium oxide (IGO), indium zinc tin oxide (IZTO), indium gallium tin oxide (IGTO), indium gallium zinc oxide (IGZO), indium gallium zinc tin oxide (IGZTO), or the like.

Although only a first transistor T1 is disposed in the sub-pixel PXn of the display device 10 in the drawings, the disclosure is not limited thereto. A greater number of transistors may be included in the display device 10.

A first gate insulating layer GI may be disposed on the semiconductor layer and the buffer layer BL. The first gate insulating layer GI may function as a gate insulating film of the first transistor T1.

The second conductive layer may be disposed on the first gate insulating layer GI. The second conductive layer may include a gate electrode G1 of the first transistor T1. The gate electrode G1 may overlap a channel region of the active layer ACT1 in a thickness direction, for example, a third direction DR3.

A first interlayer insulating layer IL1 may be disposed on the second conductive layer. The first interlayer insulating layer IL1 may function as an insulating film between the second conductive layer and other layers disposed thereon and may protect the second conductive layer.

A third conductive layer may be disposed on the first interlayer insulating layer ILL The third conductive layer may include a first voltage line VL1, a second voltage line VL2, and first and second conductive patterns CDP1 and CDP2.

A high-level voltage (or a first supply voltage) may be applied to the first voltage line VL1 to be transmitted to a first electrode RME1, and a low-level voltage (or a second supply voltage) may be applied to the second voltage line VL2 to be transmitted to a second electrode RME2. A part of the first voltage line VL1 may contact the active layer ACT1 of the first transistor T1 through a contact hole penetrating the first interlayer insulating layer IL1 and the first gate insulating layer GI. The first voltage line VL1 may function as a drain electrode D1 of the first transistor T1.

The first conductive pattern CDP1 may electrically contact the active layer ACT1 of the first transistor T1 through a contact hole penetrating the first interlayer insulating layer IL1 and the first gate insulating layer GI. The first conductive pattern CDP1 may electrically contact the bottom metal layer BML through another contact hole. The first conductive pattern CD1 may function as a source electrode S1 of the first transistor T1.

The second conductive pattern CDP2 may be electrically connected to the first transistor T1 through the first conductive pattern CDP1. In some embodiments, the second conductive pattern CDP2 may be integral with the first conductive pattern CDP1 to form a single pattern. The second conductive pattern CDP2 may also be electrically connected to the first electrode RME1. The first transistor T1 may transfer the first supply voltage, applied from the first voltage line VL1, to the first electrode RME1.

Although FIG. 5 illustrates that the first conductive pattern CDP1 and the second conductive pattern CDP2 are formed on a same layer, the disclosure is not limited thereto. In some embodiments, the second conductive pattern CDP2 may be formed as a conductive layer different from the first conductive pattern CDP1, e.g., a fourth conductive layer disposed above the third conductive layer with some insulating layers between the third conductive layer and the fourth conductive layer. The first voltage line VL1 and the second voltage line VL2 may be formed as the fourth conductive layer rather than the third conductive layer. The first voltage line VL1 may be electrically connected to the drain electrode D1 of the transistor T1 through a different conductive pattern. Although not shown in the drawings, each of the second conductive layer and the third conductive layer may further include a capacitor electrode of a storage capacitor. The capacitor electrodes of the storage capacitors may be disposed on different layers to form a capacitor in the first interlayer insulating layer IL1 therebetween. In some embodiments, each of the capacitors of the storage capacitors may be integral with the gate electrode G1 and the source electrode S1 of the first transistor T1. However, the disclosure is not limited thereto.

The buffer layer BL, the first gate insulating layer GI, and the first interlayer insulating layer IL1 may be made up of multiple inorganic layers stacked each other alternately. For example, the buffer layer BL, the first gate insulating layer GI, and the first interlayer insulating layer IL1 may include (or may be made up of) a double layer in which inorganic layers including at least one of silicon oxide ($SiO_x$), silicon nitride ($SiN_x$) and silicon oxynitride ($SiO_xN_y$) are stacked on one another or multiple layers in which they are alternately stacked on one another. However, the disclosure is not limited thereto. The buffer layer BL, the first gate insulating layer GI, and the first interlayer insulating layer IL1 may be made up of a single inorganic layer including the above-described insulating material. In some embodiments, the first interlayer insulating layer IL1 may be made of an organic insulating material such as polyimide (PI).

The second conductive layer and the third conductive layer may be made up of a single layer or multiple layers formed of one of molybdenum (Mo), aluminum (Al), chromium (Cr), gold (Au), titanium (Ti), nickel (Ni), neodymium (Nd), and copper (Cu) or an alloy thereof. However, the disclosure is not limited thereto.

A via layer VIA may be disposed on the third conductive layer. The via layer VIA may include an organic insulating material, e.g., polyimide (PI) and may provide a flat surface.

As a display element layer, electrodes RME (e.g., first to eighth electrodes RME1, RME2, RME3, RME4, RME5, RME6, RME7, and RME8), a first bank BNL1, second banks BNL2, a third bank BNL3, light-emitting diodes ED, and connection electrodes CNE (e.g., first to fifth connection electrodes CNE1, CNE2, CNE3, CNE4, and CNE5) may be disposed on the via layer VIA. Insulating layers PAS1, PAS2, and PAS3 may be disposed on the via layer VIA.

The first bank BNL1 and the second banks BNL2 may be disposed directly on the via layer VIA. The first bank BNL1 and the second banks BNL2 may have a shape extending in the first direction DR1 and may be spaced apart from each other in the second direction DR2. For example, the first bank BNL1 may be extended from the center of the emission area EMA in the first direction DR1 to be disposed beyond the emission area EMA and the sub-area SA. The first bank BNL1 may be disposed across the sub-pixels PXn arranged in the first direction DR1. The first bank BNL1 may include first and second bank portions BP1 and BP2 having a width measured in the second direction DR2 that is greater than that of other portions thereof. The bank portions BP1 and BP2 may be disposed in the emission area EMA, and they may be disposed between the second banks BNL2 spaced apart from each other in the second direction DR2.

The second banks BNL2 may be spaced apart from each other in the second direction DR2 with the first bank BNL1 therebetween. The second banks BNL2 may include first sub-banks BNL_A (e.g., first sub-banks BNL_A1 and BNL_A2) and second sub-banks BNL_B (e.g., second sub-banks BNL_B1 and BNL_B2). The first sub-banks BNL_A may be spaced apart from the second sub-banks BNL_B in the first direction DR1.

For example, a first sub-bank BNL_A1 may be disposed on the left side of the first bank portion BP1 of the first bank BNL1 that is higher than the second bank portion BP2, and a first sub-bank BNL_A2 may be disposed on the right side of the first bank portion BP1. The second sub-banks BNL_B may be spaced apart from the first sub-bank BNL_A in the first direction DR1, respectively. A second sub-bank BNL_B1 may be disposed on the left side of the second bank portion BP2 of the first bank BNL1, and a second sub-bank BNL_B2 may be disposed on the right side of the second bank portion BP2. The first bank BNL1 and the second banks BNL2 may be spaced apart from each other in the second direction DR2, and light-emitting diodes ED may be disposed therebetween.

The length of the second banks BNL2 extended in the first direction DR1 may be smaller than that of the emission area EMA in the first direction DR1 surrounded by the third bank BNL3. The first bank BNL1 may form a linear pattern extended in a direction on the front surface of the display area DPA, and the second banks BNL2 may be disposed in the emission area EMA of each sub-pixel PXn to form island-shaped patterns having a narrow width and extended in a direction.

The width of the first and second bank portions BP1 and BP2 of the first bank BNL1 measured in the second direction DR2 may be greater than that of the second banks BNL2 measured in the second direction DR2. The electrodes RME may be disposed on the first bank BNL1 or the second banks BNL2. As will be described below, the first bank BNL1 may have a greater width than the second banks BNL2 so that different electrodes RME may be disposed on the first and second bank portions BP1 and BP2. It is, however, to be understood that the present disclosure is not limited thereto. The first bank BNL1 and the second banks BNL2 may have a same width.

The first bank BNL1 and the second banks BNL2 may have a structure that at least partially protrudes from the upper surface of the via layer VIA. The protruding parts of the first banks BNL1 and the second banks BNL2 may have inclined side surfaces. The light emitted from the light-emitting diodes ED may be reflected by the electrodes RME disposed on the first banks BNL1 and the second banks BNK2 so that the light may exit toward the upper side of the via layer VIA. It is, however, to be understood that the disclosure is not limited thereto. The first banks BNL1 and the second bank layer BNL2 may have a shape of a semi-circle or semi-ellipse having a curved outer surface. The first bank BNL1 and the second banks BNL2 may include, but is not limited to, an organic insulating material such as polyimide (PI).

The electrodes RME may be extended in a direction and be disposed in each of the sub-pixels PXn. The electrodes RME may be extended in the first direction DR1 to be disposed across at least the emission area EMA and the sub-area SA of the sub-pixel PXn, and they may be spaced apart from one another in the second direction DR2.

In an embodiment, the electrodes RME may be sorted or divided into electrode groups RME #1 and RME #2 which are spaced apart from each other in the second direction DR2 and include electrodes, and the electrodes of the electrode groups RME #1 and RME #2 may be spaced apart from each other in the second direction DR2.

For example, the electrodes RME disposed in a single sub-pixel PXn may be divided into a first electrode group RME #1 and a second electrode group RME #2. The first electrode group RME #1 may be disposed on one side of the emission area EMA, for example, an upper side thereof, with respect to the center of the emission area EMA in the first direction DR1, while the second electrode group RME #2 may be disposed on another side (or opposite side), e.g., a lower side of the emission area EMA, and may be spaced apart from the first electrode group RME #1 in the first direction DR1. The first electrode group RME #1 and the second electrode group RME #2 of the sub-pixel PXn may be spaced apart from each other with respect to a first separation portion ROP1 positioned in the emission area EMA.

The electrodes RME of the first electrode group RME #1 may be partially disposed in the sub-area SA of the sub-pixel PXn beyond the third bank BNL3, and the electrodes RME of the second electrode group RME #2 may also be partially disposed in the sub-area SA of another sub-pixel PXn beyond the third bank BNL3. In the sub-area SA, the first electrode group RME #1 and the second electrode group RME #2 of different sub-pixels PXn may be spaced apart from each other. The first electrode group RME #1 and the second electrode group RME #2 of different sub-pixels PXn may be spaced apart from each other with respect to a second separation portion ROP2 positioned in the sub-area SA of a sub-pixel PXn.

The electrodes of the different electrode groups RME #1 and RME #2 may be arranged side-by-side in the first direction DR1. An electrode belonging to the first electrode group RME #1 may be arranged parallel to an electrode belonging to the second electrode group RME #2 in the first direction DR1. Such an arrangement of the electrodes RME may be formed by forming a single electrode line extended in the first direction DR1, disposing the light-emitting diodes ED thereon, and separating the electrode line therefrom during a subsequent process. The electrode line may be used to generate an electric field in the sub-pixel PXn to align the light-emitting diodes ED during the process of fabricating the display device 10. After the light-emitting diodes ED are aligned, the electrode line may be separated from the first separation portion ROP1 and the second separation portion ROP2, such that the electrode groups RME #1 and RME #2 spaced apart from each other may be formed.

The electrodes included in each of the electrode groups RME #1 and RME #2 will be described in detail. Each of the electrode groups RME #1 and RME #2 may include electrodes spaced apart from one another in the second direction DR2. For example, the first electrode group RME #1 may include a first electrode RME1, a second electrode RME2, a third electrode RME3, and a fourth electrode RME4, and the second electrode group RME #2 may include a fifth electrode RME5, a sixth electrode RME6, a seventh electrode RME7, and an eighth electrode RME8. The electrodes RME disposed in each of the sub-pixels PXn may be disposed on the first bank BNL1 or the second banks BNL2 spaced apart from one another.

The first electrode group RME #1 may be disposed on an upper side of the first separation portion ROP1 in the first direction DR1, and the first electrode RME1, the second electrode RME2, the third electrode RME3, and the fourth electrode RME4 may be sequentially arranged and spaced apart from one another in the second direction DR2. The electrodes of the first electrode group RME #1 may be extended from the first separation portion ROP1 positioned in the emission area EMA of the sub-pixel PXn to the second separation portion ROP2 positioned in the sub-area SA of the sub-pixel PXn.

The first electrode RME1 may be disposed on the left side of the center of the emission area EMA, and a part thereof may be disposed on the first sub-bank BNL_A1 disposed on the left side of the first bank BNL1. The second electrode RME2 may be spaced apart from the first electrode RME1 in the second direction DR2 and may be disposed adjacent to the center of the emission area EMA. A part of the second electrode RME2 may be disposed on one side (or first side) of the first bank portion BP1 facing the first sub-bank BNL_A1 disposed on the left side of the first bank BNL1.

The third electrode RME3 may be spaced apart from the second electrode RME2 in the second direction DR2 and may be disposed adjacent to the center of the emission area EMA. A part of the third electrode RME3 may be disposed on another side (or opposite side or second side) of the first bank portion BP1 facing the first sub-bank BNL_A2 disposed on the right side of the first bank BNL1. The fourth electrode RME4 may be spaced apart from the third electrode RME3 in the second direction DR2 and may be disposed on the right side of the center of the emission area EMA. A part of the fourth electrode RME4 may be disposed on the first sub-bank BNL_A2 disposed on the right side of the first bank BNL1.

The electrodes of the second electrode group RME #2 may be spaced apart from those of the first electrode group RME #1 in the first direction DR1. The second electrode group RME #2 may be disposed on another side (or opposite side or second side) of the region ROP1, for example, a lower side thereof in the first direction DR1, and the fifth electrode RME5, the sixth electrode RME6, the seventh electrode RME7, and the eighth electrode RME8 may be sequentially arranged and spaced apart from one another in the second direction DR2. The electrodes of the second electrode group RME #2 may be extended from the first separation portion ROP1 positioned in the emission area EMA of the sub-pixel PXn to the second separation portion ROP2 positioned in the sub-area SA of another sub-pixel PXn adjacent to the sub-pixel PXn in the first direction DR1.

The fifth electrode RME5 may be disposed on the left side of the center of the emission area EMA, and a part thereof may be disposed on the second sub-bank BNL_B1 disposed on the left side of the first bank BNL1. The sixth electrode RME6 may be spaced apart from the fifth electrode RME5 in the second direction DR2 and may be disposed adjacent to the center of the emission area EMA. A part of the sixth electrode RME6 may be disposed on one side of the second bank portion BP2 facing the second sub-bank BNL_B1 disposed on the left side of the first bank BNL1.

The seventh electrode RME7 may be spaced apart from the sixth electrode RME6 in the second direction DR2 and may be disposed adjacent to the center of the emission area EMA. A part of the seventh electrode RME7 may be disposed on the opposite side of the second bank portion BP2 facing the second sub-bank BNL_B2 disposed on the right side of the first bank BNL1. The eighth electrode RME8 may be spaced apart from the seventh electrode RME7 in the second direction DR2 and may be disposed on the right side of the center of the emission area EMA. A part of the eighth electrode RME8 may be disposed on the second sub-bank BNL_B2 disposed on the right side of the first bank BNL1.

The electrodes RME may be distinguished from one another depending on whether each of them is electrically connected to a conductive layer thereunder or not. For example, the first electrode RME1 and the seventh electrode RME7 may be electrically connected to the third conductive layer thereunder, and the other electrodes may not.

The first electrode RME1 and the seventh electrode RME7 may be electrically connected to the third conductive layer through a first electrode contact hole CTD and a second electrode contact hole CTS, respectively, which are formed in portions in which the first electrode RME1 and the seventh electrode RME7 overlap the third bank BNL3. The first electrode RME1 may electrically contact the second conductive pattern CDP2 through the first electrode contact hole CTD penetrating through the via layer VIA thereunder. The seventh electrode RME7 may electrically contact the second voltage line VL2 through the second electrode contact hole CTS penetrating through the via layer VIA thereunder. The first electrode RME1 may be electrically connected to the first transistor T1 through the first conductive pattern CDP1 to receive the first supply voltage. The seventh electrode RME7 may be electrically connected to the second voltage line VL2 to receive the second supply voltage.

However, the disclosure is not limited thereto. In some embodiments, the first electrode RME1 may be electrically connected to the second voltage line VL2, and the seventh electrode RME7 may be electrically connected to the first voltage line VL1. Although FIG. 5 illustrates that the first electrode contact hole CTD and the second electrode contact hole CTS are formed under the third bank BNL3, the disclosure is not limited thereto. The first electrode contact hole CTD and the second electrode contact hole CTS may be formed in other positions. For example, the first electrode contact hole CTD and the second electrode contact hole CTS may be formed in the emission area EMA or the sub-area SA.

On the other hand, other electrodes may not be directly and electrically connected to the third conductive layer. The other electrodes may be electrically connected to the first electrode RME1 or the seventh electrode RME7 through the connection electrodes CNE and the light-emitting diodes ED, which will be described below. It is, however, to be understood that the present disclosure is not limited thereto. In some embodiments, the other electrodes may be floating electrodes that are not electrically connected to the electrode or the light-emitting diodes ED. It is to be noted that the first electrode RME1 and the seventh electrode RME7 are not necessarily connected directly to the third conductive layer. Other electrodes may be connected to the third conductive layer depending on the arrangement and connection of the light-emitting diodes ED and the connection electrodes CNE to be described below.

The electrodes RME may be disposed at least on the inclined side surfaces of the first bank BNL1 or the second bank BNL2. In an embodiment, the width of the electrodes RME measured in the second direction DR2 may be smaller than that of the first banks BNL1 or the second bank BNL2 measured in the second direction DR2. Each of the electrodes RME may cover or overlap at least one side of the first banks BNL1 or the second bank BNK2 to reflect light emitted from the light-emitting diodes ED.

The distance between the electrodes RME spaced apart from each other in the second direction DR2 may be smaller than that between the first banks BNL1 and the second bank BNL2. At least a part of each of the electrodes RME may be disposed directly on the via layer VIA so that they may be disposed on a same plane.

The electrodes RME may be electrically connected to the light-emitting diodes ED. The electrodes RME may be electrically connected to the light-emitting diodes ED through the connection electrodes CNE (e.g., first to fifth connection electrodes CNE1, CNE2, CNE3, CNE4, and CNE5) to be described below and may transmit electric signals applied from a conductive layer thereunder to the light-emitting diodes ED.

Each of the electrodes RME may include a conductive material having a high reflectance. For example, the electrodes RME may include a metal such as silver (Ag), copper (Cu), and aluminum (Al) as the material having a high reflectance and may be an alloy including aluminum (Al), nickel (Ni), lanthanum (La), or the like. The electrodes RME may reflect light that is emitted by the light-emitting diodes ED and travels to the side surfaces of the first banks BNL1 and the second banks BNL2 toward the upper side of each of the sub-pixels PXn.

It is, however, to be understood that the present disclosure is not limited thereto. The electrodes RME may further include a transparent conductive material. For example, each of the electrodes RME may include a material such as ITO, IZO, and ITZO. In some embodiments, each of the electrodes RME1 and RME2 may have a structure in which one or more layers of a transparent conductive material and one or more metal layers having high reflectivity are stacked on one another, or may be made up of a single layer including them. For example, each of the electrodes RME may have a stack structure such as ITO/Ag/ITO, ITO/Ag/IZO, or ITO/Ag/ITZO/IZO.

The first insulating layer PAS1 may be disposed on the via layer VIA and the electrodes RME. The first insulating layer PAS1 may cover or overlap the electrodes RME entirely and may protect the electrodes RME and insulate them from one another. The first insulating layer PAS1 may also prevent the light-emitting diodes ED, disposed thereon, from being damaged by directly contacting other elements.

In an embodiment, the first insulating layer PAS1 may have steps so that a part of the upper surface thereof is recessed between the electrodes RME spaced apart from one another in the second direction DR2. The light-emitting diodes ED may be disposed on the steps of the upper surface of the first insulating layer PAS1, and spaces may be formed between the light-emitting diodes ED and the first insulating layer PAS1.

The first insulating layer PAS1 may include contact parts CT1, CT2, CT3, CT4, and CT5 exposing a part of the upper surface of each of the electrodes RME. The contact parts CT1, CT2, CT3, CT4, and CT5 may penetrate through the first insulating layer PAS1, and the connection electrodes CNE to be described below may contact the electrodes RME exposed through the contact parts CT1, CT2, CT3, CT4, and CT5.

The third bank BNL3 may be disposed on the first insulating layer PAS1. The third bank BNL3 may be disposed in a lattice pattern including parts extended in the first direction DR1 and the second direction DR2 in a plan view, and may be disposed at the boundaries of the sub-pixels PXn to distinguish the adjacent sub-pixels PXn from each other.

The third bank BNL3 may surround the emission area EMA and the sub-area SA, and the areas defined and opened by the third bank BNL3 may be the emission area EMA and the sub-area SA.

The third bank BNL3 may have a height. In some embodiments, the upper surface of the third bank BNL3 may be higher than that of the first bank BNL1 and the second bank BNL2, and the thickness thereof may be equal to or greater than that of the first bank BNL1 and the second bank BNL2. The third bank BNL3 may prevent an ink from overflowing into adjacent sub-pixels PXn during an inkjet printing process of the process of fabricating the display device 10. The third bank BNL3 may prevent inks of different sub-pixels PXn, in which different light-emitting diodes ED are dispersed, from being mixed with each other. Similar to the first bank BNL1, third bank BNL3 may include, but is not limited to, polyimide.

The light-emitting diodes ED may be disposed on the first insulating layer PAS1. The light-emitting diodes ED may include multiple layers disposed on the upper surface of the first substrate SUB in the direction parallel thereto. The light-emitting elements 30 of the display device 10 may be arranged such that they are extended in parallel to the first substrate SUB. The multiple semiconductor layers included in the light-emitting elements 30 may be disposed sequentially in the direction parallel to the upper surface of the first substrate SUB. It is, however, to be understood that the present disclosure is not limited thereto. In some embodiments, in case that the light-emitting diodes ED have a different structure, layers may be disposed in a direction perpendicular to the first substrate SUB.

The light-emitting diodes ED may be disposed on the electrodes RME that are provided between the first banks BNL1 and the second bank BNL2 and spaced apart from each other in the second direction DR2. The light-emitting diodes ED may be spaced apart from one another in the first direction DR1 in which the electrodes RME are extended, and may be aligned substantially parallel to one another. The light-emitting diodes ED may have a shape extended in a direction and may have a length greater than the shortest distance between electrodes RME spaced apart from one another in the second direction DR2. Both ends of each of the light-emitting diodes ED may be disposed on different electrodes RME, and the direction in which the electrodes RME are extended may be substantially perpendicular to that in which the light-emitting diodes ED are extended. It is, however, to be understood that the present disclosure is not limited thereto. The light-emitting diodes ED may be disposed obliquely to the direction in which the electrodes RME are extended.

The light-emitting diodes ED disposed in each of the sub-pixels PXn may emit light of different wavelength bands depending on the material of the semiconductor layer. It is, however, to be understood that the present disclosure is not limited thereto. The light-emitting diodes ED disposed in the sub-pixels PXn may emit light of a same color. The light-emitting diodes ED may include semiconductor layers doped with impurities of different conductivity types and may be aligned so that their ends face in a particular direction depending on the electric field generated over the electrodes RME.

The light-emitting diodes ED may have a shape extended in a direction and may be sorted or divided into different light-emitting elements ED depending on the electrodes RME on which both ends of the light-emitting diodes ED are positioned. For example, the light-emitting diodes ED may include, as the light-emitting diodes ED disposed on the first electrode groups RME #1, first light-emitting diodes ED1 having both ends disposed on the first electrode RME1 and the second electrode RME2, respectively, and second light-emitting diodes ED2 having both ends disposed on the third electrode RME3 and the fourth electrode RME4, respectively. For example, the light-emitting diodes ED may include, as the light-emitting diodes ED disposed on the second electrode groups RME #2, third light-emitting diodes ED3 having both ends disposed on the fifth electrode RME5 and the sixth electrode RME6, respectively, and fourth light-emitting diodes ED4 having both ends disposed on the seventh electrode RME7 and the eighth electrode RME8, respectively. Both ends of each of the light-emitting diodes ED (e.g., the first to fourth light-emitting diodes ED1, ED2, ED3, and ED4) may electrically contact different connection electrodes CNE, respectively, and may be electrically connected to the electrodes RME through them.

Each of the light-emitting diodes ED may include semiconductor layers, and a first end and a second end opposite to the first end may be defined based on one of the semiconductor layers. The first end and the second end of each of the light-emitting diodes ED may face in different directions. For example, the first end of each of the first light-emitting diodes ED1 may be disposed on the first electrode RME1 while the second end thereof may be disposed on the second electrode RME2. The first end of each of the third light-emitting diodes ED3 may be disposed on the fifth electrode RME5 while the second end thereof may be disposed on the sixth electrode RME6. The first ends of the first and third light-emitting diodes ED1 and ED3 may face the left side, which is one side in the second direction DR2. On the other hand, the first end of each of the second light-emitting diodes ED2 may be disposed on the fourth electrode RME4 while the second end thereof may be disposed on the third electrode RME3. The first end of each of the fourth light-emitting diodes ED4 may be disposed on the eighth electrode RME8 while the second end thereof may be disposed on the seventh electrode RME7. The first ends of the second and fourth light-emitting diodes ED2 and ED4 may face the right side, which is the opposite side in the second direction DR2.

As used herein, "both sides" of the light-emitting diodes ED may refer to one side (or first side) and another side (or opposite side or second side) in the direction in which they are extended, regardless of the type of the semiconductor layer included in the light-emitting diodes ED. On the other hand, "both ends" of the light-emitting diodes ED may be distinguished by the position of the semiconductor layer included in the light-emitting diodes ED. Therefore, one side or the opposite side of a light-emitting diode ED and the first end or the second end of the light-emitting diode ED may be used to indicate a same part in some embodiments and indicate a different part in other embodiments. For example, for the first light-emitting diodes ED1 and the third light-emitting diodes ED3, the one side may refer to the first end while the opposite side may refer to the second end. For the second light-emitting diodes ED2 and the fourth light-emitting diodes ED4, the one side may refer to the second end while the opposite side may refer to the first end. For example, "both sides" of the light-emitting diode ED may refer to the one side and the opposite side in the second direction DR2 in a plan view, while "both ends" of the light-emitting diode ED may refer to the first end and the second end with respect to the position where the semiconductor layers are positioned in the light-emitting diode ED. In the following description, both sides of the light-emitting diodes ED may be defined based on their positions and may be associated with the contact with the connection electrode CNE, while both ends of the light-emitting diodes ED may be defined based on the type of the semiconductor layer and may be associated with the electrical connection with the connection electrodes CNE.

The light-emitting diodes ED may electrically contact the connection electrodes CNE (e.g., first to fifth connection electrodes CNE1, CNE2, CNE3, CNE4, and CNE5) so that they may be electrically connected thereto. As a part of the semiconductor layer of each of the light-emitting diodes ED is exposed at the end surface on one side of the light-emitting diode ED in the direction in which they are extended, the exposed part of the semiconductor layer may electrically contact the contact electrode CNE. Each of the light-emitting diodes ED may be electrically connected to the conductive layers under the first electrode RME1 or the via layer VIA through the connection electrodes CNE, and an electric signal may be applied to the light-emitting diodes ED so that light of a particular wavelength band may be emitted.

The second insulating layer PAS2 may be disposed on the light-emitting diodes ED. For example, the second insulating layer PAS2 may be disposed to partially surround the outer surfaces of the light-emitting diodes ED so that both sides or both ends of the light-emitting diodes ED are not covered or overlapped thereby. The part of the second insulating layer PAS2 which is disposed on the light-emitting diode ED may be extended in the first direction DR1 on the first insulating layer PAS1 in a plan view, thereby forming a linear or island-like pattern in each of the sub-pixels PXn. The second insulating layer PAS2 may protect the light-emitting diodes ED and fix the light-emitting diodes ED during the process of fabricating the display device 10. The second insulating layer PAS2 may fill the space between light-emitting diodes ED and the first insulating layer PAS1 thereunder.

The second insulating layer PAS2 may also be disposed on the first bank BNL1, the second bank BNL2, and the third bank BNL3. The second insulating layer PAS2 may be disposed on the first insulating layer PAS1 and may expose some parts where the electrodes RME are disposed together with both sides of the light-emitting diodes ED. The shape of the second insulating layer PAS2 may be formed by entirely forming the second insulating layer PAS2 on the first insulating layer PAS1 during the process of fabricating the display device 10 and removing the parts of the second insulating layer PAS2 during the process of exposing both sides of the light-emitting diodes ED.

The second insulating layer PAS2 may be partially disposed in the sub-area SA. During the process of disposing the light-emitting diodes ED and separating the electrode line into parts, the first insulating layer PAS1 and the second insulating layer PAS2 may be partially removed as well. A part of the via layer VIA may be exposed in the separation portions ROP. The third insulating layer PAS3 may be disposed directly on the exposed part of the via layer VIA.

The connection electrodes CNE (e.g., first to fifth connection electrodes CNE1, CNE2, CNE3, CNE4, and CNE5) and the third insulating layer PAS3 may be disposed on the second insulating layer PAS2.

The connection electrodes CNE may be disposed on the light-emitting diodes ED and the electrodes RME. The connection electrodes CNE may be partially disposed on the second insulating layer PAS2 and may be insulated from other connection electrodes CNE by the second insulating layer PAS2 and the third insulating layer PAS3. The connection electrodes CNE may electrically contact the light-emitting diodes ED and the electrodes RME. The connection electrodes CNE may directly contact the semiconductor layer exposed at both end surfaces of the light-emitting diodes ED and may electrically contact at least one of the electrodes RME through the contact parts CT1, CT2, CT3, CT4, and CT5 penetrating through the first insulating layer PAS1. Both ends of the light-emitting diodes ED may be electrically connected to the electrodes RME through the connection electrodes CNE1, CNE2, and CNE3.

In an embodiment, the connection electrodes CNE of the display device 10 may be divided into connection electrodes disposed on different layers. For example, the connection electrodes CNE may include a first connection electrode CNE1, a second connection electrode CNE2, and a fourth connection electrode CNE4 as a first connection electrode layer CNE #1 disposed on the third insulating layer PAS3, and a third connection electrode CNE3 and a fifth connection electrode CNE5 as a second connection electrode layer CNE #2 disposed between the second insulating layer PAS2 and the third insulating layer PAS3.

The first connection electrode CNE1 may have a shape extended in the first direction DR1 and may be disposed on the first electrode RME1. The first connection electrode CNE1 may electrically contact the first electrode RME1 through the first contact part CT1 exposing the upper surface of the first electrode RME1 and may electrically contact one side or the first end of the first light-emitting diodes ED1. The second connection electrode CNE2 may have a shape extended in the first direction DR1 and may be disposed on the seventh electrode RME7. The second connection electrode CNE2 may electrically contact the seventh electrode RME7 through the second contact part CT2 exposing the upper surface of the seventh electrode RME7 and may electrically contact one side or the second end of the fourth light-emitting diode ED4.

The first contact electrode CNE1 and the second contact electrode CNE2 may transmit electric signals, applied to the first electrodes RME1 and the seventh electrode RME7 to an end of each of the light-emitting diodes ED. The electric signal may be directly applied to the first end of each of the first light-emitting diodes ED1 and the second end of each of the fourth light-emitting diodes ED4. The electric signal may be transmitted to other connection electrodes CNE and the light-emitting diodes ED through the second end of each of the first light-emitting diodes ED1 and the first end of each of the fourth light-emitting diodes DE4.

The third connection electrode CNE3 may be disposed across the second electrode RME2 and the fourth electrode RME4 as the electrodes of the first electrode group RME #1. The third connection electrode CNE3 may include a first extended portion CN_E1 and a second extended portion CN_E2 extended in the first direction DR1, and first bridge portions CN_B1 connecting the first extended portion CN_E1 with the second extended portion CN_E2.

The first extended portion CN_E1 may be disposed on the second electrode RME2, and the second extended portion CN_E2 may be disposed on the fourth electrode RME4. The first extended portion CN_E1 may be spaced apart from and face the first connection electrode CNE1, and the second extended portion CN_E2 may be spaced apart from a third extended portion CN_E3 of the fourth connection electrode CNE4. The first extended portion CN_E1 and the second extended portion CN_E2 may electrically contact the second electrode RME2 and the fourth electrode RME4 exposed through the third contact parts CT3, respectively. The first extended portion CN_E1 may electrically contact the other side or the second end of each of the first light-emitting diodes ED1, and the second extended portion CN_E2 may electrically contact the other side or the first end of each of the second light-emitting diodes ED2. Electric signals may be transmitted to each of the second electrode RME2 and the fourth electrode RME4 through the third connection electrode CNE3. The first bridge portion CN_B1 may have a shape extended in the second direction DR2 and may be spaced apart from the first separation portion ROP1 in the first direction DR1. The first bridge portion CN_B1 may be disposed in the space between the second banks BNL2 and the third bank BNL3. The third connection electrode CNE3 may have a shape surrounding the third extended portion CN_E3 of the fourth connection electrode CNE4 to be described below in a plan view.

The fourth connection electrode CNE4 may be disposed across the third electrode RME3 as one electrode of the first electrode group RME #1 and across the fifth electrode RME5 as one of the second electrode group RME #2. The fourth connection electrode CNE4 may include a third extended portion CN_E3 and a fourth extended portion CN_E4 extended in the first direction DR1 and second bridge portions CN_B2 connecting the third extended portion CN_E3 with the fourth extended portion CN_E4.

The third extended portion CN_E3 may be disposed on the third electrode RME3, and the fourth extended portion CN_E4 may be disposed on the fifth electrode RME5. The third extended portion CN_E3 may be spaced apart from and face the second extended portion CN_E2 of the third connection electrode CNE3, and the fourth extended portion CN_E4 may be spaced apart from and face a fifth extended portion CN_E5 of the fifth connection electrode CNE5 to be described below. The third extended portion CN_E3 and the fourth extended portion CN_E4 may electrically contact the third electrode RME3 and the fifth electrode RME5 exposed through the fourth contact parts CT4, respectively. The third extended portion CN_E3 may electrically contact one side or the second end of each of the second light-emitting diodes ED2, and the fourth extended portion CN_E4 may electrically contact one side or the first end of each of the third light-emitting diodes ED3. Electric signals may be transmitted to each of the third electrode RME3 and the fifth electrode RME5 through the fourth connection electrode CNE4. The second bridge portion CN_B2 may have a shape extended in the second direction DR2 and may be disposed in the first separation portion ROP1.

The fifth connection electrode CNE5 may be disposed across the sixth electrode RME6 and the eighth electrode RME8 as the electrodes of the second electrode group RME #2. The fifth connection electrode CNE5 may include the fifth extended portion CN_E5 and a sixth extended portion CN_E6 extended in the first direction DR1 and third bridge portions CN_B3 connecting the fifth extended portion CN_E5 with the sixth extended portion CN_E6.

The fifth extended portion CN_E5 may be disposed on the sixth electrode RME6, and the sixth extended portion CN_E6 may be disposed on the eighth electrode RME8. The fifth extended portion CN_E5 may be spaced apart from and face the fourth extended portion CN_E4 of the fourth connection electrode CNE4, and the sixth extended portion CN_E6 may be spaced apart from and face the second connection electrode CNE2. The fifth extended portion CN_E5 and the sixth extended portion CN_E6 may electrically contact the sixth electrode RME6 and the eighth electrode RME8 exposed through the fifth contact parts CT5, respectively. The fifth extended portion CN_E5 may electrically contact the opposite side or the second end of each of the third light-emitting diodes ED3, and the sixth extended portion CN_E6 may electrically contact the opposite side or the first end of each of the fourth light-emitting diodes ED4. Electric signals may be transmitted to each of the sixth electrode RME6 and the eighth electrode RME8 through the fifth connection electrode CNE5. The third bridge portion CN_B3 may have a shape extended in the second direction DR2 and may be spaced apart from the first separation portion ROP1 in the first direction DR1. The third bridge portion CN_B3 may be disposed in the space between the second banks BNL2 and the third bank BNL3. The fifth connection electrode CNE5 may have a shape surrounding the second connection electrode CNE2 in a plan view.

The connection electrodes CNE may be spaced apart from one another in the second direction DR2 in a plan view. The first connection electrode CNE1, the second connection electrode CNE2, and the first to sixth extended portions CN_E1, CN_E2, CN_E3, CN_E4, CN_E5, and CN_E6 of the third to fifth connection electrodes CNE3, CNE4, and CNE5 may be spaced apart from one another by a distance so that they are not directly and electrically connected with one another. The different connection electrodes CNE may be spaced apart from one another so that they are not electrically connected to one another, and may be insulated from one another by the third insulating layer PAS3 disposed therebetween.

The connection electrodes CNE may be sorted or divided into a first-type connection electrode and a second-type connection electrode depending on the type and shape of the electrodes RME on which they are disposed. The connection electrodes CNE may include the first-type connection electrode disposed on an electrode directly and electrically connected to the third conductive layer and the second-type connection electrode disposed on electrodes not directly and electrically connected to the third conductive layer. The first connection electrode CNE1 and the second connection electrode CNE2 may be the first-type connection electrodes, while the third connection electrode CNE3, the fourth connection electrode CNE4, and the fifth connection electrode CNE5 may be the second-type connection electrodes.

Each of the first connection electrode CNE1 and the second connection electrode CNE2 may be disposed on only one of the electrodes RME. The first connection electrode CNE1 and the second connection electrode CNE2 may have a shape extended in a direction and may electrically connect the electrodes RME directly connected to the third conductive layer with the light-emitting diodes ED. On the other hand, the third connection electrode CNE3, the fourth connection electrode CNE4, and the fifth connection electrode CNE5 may each include extended portions and may be disposed on one or more electrodes. The third connection electrode CNE3, the fourth connection electrode CNE4, and the fifth connection electrode CNE5 may have a partially bent shape and may electrically connect light-emitting diodes ED with one another.

The first light-emitting diodes ED1 and the second light-emitting diodes ED2 may be electrically connected to each other through the third connection electrode CNE3. The electric signal applied through the first connection electrode CNE1 may be transmitted to the second light-emitting diodes ED2 through the first light-emitting diodes ED1 and the third connection electrode CNE3. Similarly, the second light-emitting diodes ED2 and the third light-emitting diodes ED3 may be electrically connected with each other through the fourth connection electrode CNE4, and the third light-emitting diodes ED3 and the fourth light-emitting diodes ED4 may be electrically connected with each other through the fifth connection electrode CNE5. The light-emitting diodes ED disposed in a sub-pixel PXn may be electrically connected in series through the second-type connection electrodes.

The connection electrodes CNE may have a greater width in portions where the contact parts CT1, CT2, CT3, CT4, and CT5 are formed. The contact parts CT1, CT2, CT3, CT4, and CT5 may be formed so that they do not overlap the light-emitting diodes ED in the second direction DR2. The contact parts CT1, CT2, CT3, CT4, and CT5 may be formed such that they are spaced apart in the first direction DR1 from the area where light-emitting diodes ED are disposed. Light may be emitted from both ends of the light-emitting diodes ED, and the contact parts CT1, CT2, CT3, CT4, and CT5 may be positioned outside of the path of the light. Although the contact parts CT1, CT2, CT3, CT4 and CT5 are formed in the emission area EMA in the drawings, the disclosure is not limited thereto. The contact parts CT1, CT2, CT3, CT4, and CT5 may be formed in the sub-area SA where the light-emitting diodes ED are not disposed. It is possible to reduce the light, emitted from the light-emitting diodes ED, from being reflected and refracted at the contact parts CT1, CT2, CT3, CT4, and CT5, and it is possible to prevent the light-emitting diodes ED from sticking together around the contact holes by the contact parts CT1, CT2, CT3, CT4, and CT5 exposing the upper surfaces of the electrode lines during the process of fabricating the display device 10.

The connection electrodes CNE may include a conductive material. For example, the connection electrodes CNE may include ITO, IZO, ITZO, aluminum (Al), or the like. For example, the connection electrodes CNE may include a transparent conductive material, and light emitted from the light-emitting diodes ED may transmit the connection electrodes CNE to proceed toward the electrodes RME. However, the disclosure is not limited thereto.

The third insulating layer PAS3 may be disposed on the second connection electrode layer CNE #2 and the second insulating layer PAS2. The third insulating layer PAS3 may be disposed entirely on the second insulating layer PAS2 to cover the connection electrodes CNE of the second connection electrode layer CNE #2, and the connection electrodes CNE of the first connection electrode layer CNE #1 may be disposed on the third insulating layer PAS3. The third insulating layer PAS3 may be disposed entirely on the via layer VIA except for the areas where the connection electrodes CNE of the first connection electrode layer CNE #1 are disposed. For example, the third insulating layer PAS3 may also be disposed on the first bank BNL1, the second bank BNL2, and the third bank BNL3 in addition to the first insulating layer PAS1 and the second insulating layer PAS2. The third insulating layer PAS3 may insulate the connection electrodes CNE of the first connection electrode layer CNE #1 from the connection electrodes CNE of the second connection electrode layer CNE #2 so that they do not directly contact each other.

In some embodiments, the third insulating layer PAS3 may be removed from the display device 10. Therefore, the connection electrodes CNE may be disposed directly on the second insulating layer PAS2 and may be disposed on substantially a same layer.

Although not shown in the drawings, another insulating layer may be further disposed on the first connection electrode layer CNE #1 and the third insulating layer PAS3. The insulating layer may protect the elements disposed on the first substrate SUB from an external environment.

Each of the above-described first insulating layer PAS1, second insulating layer PAS2, and third insulating layer PAS3 may include an inorganic insulating material or an organic insulating material. It is, however, to be understood that the present disclosure is not limited thereto.

Figure 9:
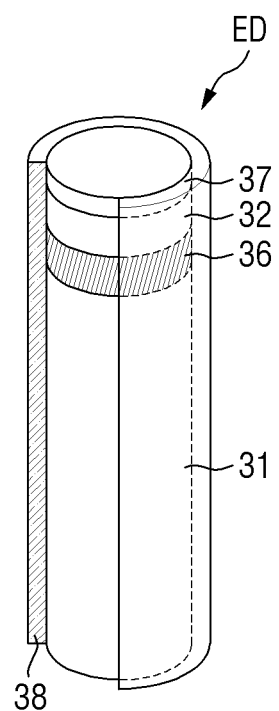
FIG. 9 is a schematic perspective view showing a light-emitting element according to an embodiment of the disclosure.

FIG. 9 is a schematic view illustrating a light-emitting element according to an embodiment.

Referring to FIG. 9, a light-emitting element ED may be a light-emitting diode. Specifically, the light-emitting element ED may have a size from nanometers to micrometers and may be an inorganic light-emitting diode made of an inorganic material. The light-emitting diode ED may be aligned between two electrodes facing each other as polarities are created by forming an electric field in a particular direction between the two electrodes.

In an embodiment, the light-emitting diode ED may have a shape extended in a direction. The light-emitting element ED may have the shape of a cylinder, a rod, a wire, a tube, or the like. It is to be understood that the shape of the light-emitting diode ED is not limited thereto. The light-emitting diode ED may have a variety of shapes including a shape of a polygonal column such as a cube, a cuboid, or a hexagonal column, or a shape that is extended in a direction and has a partially inclined outer surface.

The light-emitting diode ED may include semiconductor layers doped with impurities of a conductive type (e.g., a p- or n-type). The semiconductor layers may emit light of a particular wavelength band by receiving an electric signal applied from an external power source. The light-emitting diode ED may include a first semiconductor layer 31, a second semiconductor layer 32, an emission layer 36, an electrode layer 37, and an insulating film 38.

The first semiconductor layer 31 may be an n-type semiconductor. The first semiconductor layer 31 may include a semiconductor material having a chemical formula: $Al_xGa_yIn_{1-x-y}N$ ($0 \leq x \leq 1$, $0 \leq y \leq 1$, $0 \leq x+y \leq 1$). For example, the first semiconductor layer 31 may be doped with an n-type dopant and be formed of one or more of AlGaInN, GaN, AlGaN, InGaN, AlN and InN. The n-type dopant of the first semiconductor layer 31 may be Si, Ge, Sn, or the like.

The second semiconductor layer 32 may be disposed above the first semiconductor layer 31 with the emission layer 36 therebetween. The second semiconductor layer 32 may be a p-type semiconductor and may include a semiconductor material having a chemical formula: $Al_xGa_yIn_{1-x-y}N$ ($0 \leq x \leq 1$, $0 \leq y \leq 1$, $0 \leq x+y \leq 1$). For example, the second semiconductor layer 32 may be doped with a p-type dopant and be formed of one or more of AlGaInN, GaN, AlGaN, InGaN, AlN, and InN. The p-type dopant of the second semiconductor layer 32 may be Mg, Zn, Ca, Se, Ba, or the like.

Although each of the first semiconductor layer 31 and the second semiconductor layer 32 is implemented as a signal layer in the drawings, the disclosure is not limited thereto. Depending on the material of the emission layer 36, the first semiconductor layer 31 and the second semiconductor layer 32 may further include a greater number of layers, e.g., a clad layer or a tensile strain barrier reducing (TSBR) layer.

The emission layer 36 may be disposed between the first semiconductor layer 31 and the second semiconductor layer 32. The emission layer 36 may include a material having a single or multiple quantum well structure. In case that the emission layer 36 includes a material having the multiple quantum well structure, the structure may include quantum layers and well layers alternately stacked each other. The emission layer 36 may emit light as electron-hole pairs are combined with each other therein in response to an electrical signal applied through the first semiconductor layer 31 and the second semiconductor layer 32. The emission layer 36 may include a material such as AlGaN and AlGaInN. In particular, in case that the emission layer 36 has a multi-quantum well structure in which quantum layers and well layers are alternately stacked each other, the quantum layers may include AlGaN or AlGaInN, and the well layers may include a material such as GaN and AlInN.

The emission layer 36 may have a structure in which a semiconductor material having a large band gap energy and a semiconductor material having a small band gap energy are alternately stacked each other, and may include Group III to V semiconductor materials depending on the wavelength band of the emitted light. Accordingly, the light emitted from the emission layer 36 is not limited to the light of the blue wavelength band. The emission layer 36 may emit light of a red or green wavelength band in some embodiments.

The electrode layer 37 may be an ohmic connection electrode. It is, however, to be understood that the present disclosure is not limited thereto. The electrode layer 37 may be a Schottky connection electrode. The light-emitting diode ED may include at least one electrode layer 37. The light-emitting diode ED may include one or more electrode layers 37. It is, however, to be understood that the present disclosure is not limited thereto. The electrode layer 37 may be removed.

The electrode layer 37 may reduce the resistance between the light-emitting element ED and the electrodes or the connection electrodes in case that the light-emitting element ED is electrically connected to the electrodes or the connection electrodes in the display device 10. The electrode layer 37 may include a metal having conductivity. For example, the electrode layer 37 may include at least one of aluminum (Al), titanium (Ti), indium (In), gold (Au), silver (Ag), ITO, IZO, and ITZO.

The insulating film 38 may surround the outer surfaces of the semiconductor layers and electrode layers described above. For example, the insulating film 38 may surround at least the outer surface of the emission layer 36, with both ends of the light-emitting element ED exposed in the longitudinal direction. A part of the upper surface of the insulating film 38 may be rounded in a cross-sectional view, and the part may be adjacent to at least one end of the light-emitting diode ED.

The insulating film 38 may include materials having insulating properties such as silicon oxide ($SiO_x$), silicon nitride ($SiN_x$), silicon oxynitride ($SiO_xN_y$), aluminum nitride ($AlN_x$), and aluminum oxide ($AlO_x$). Although FIG. 9 illustrates that the insulating film 38 is formed as a single layer, the disclosure is not limited thereto. In some embodiments, the insulating film 38 may have a multilayer structure in which multiple layers are stacked each other.

The insulating film 38 may serve to protect the first semiconductor layer 31, the second semiconductor layer 32, the emission layer 36, and the electrode layer 37. The insulating film 38 may prevent an electrical short-circuit that may occur in the emission layer 36 if the insulating film 38 directly contacts an electrode through which an electric signal is transmitted to the light-emitting diode ED. The insulating film 38 may prevent a decrease in luminous efficiency of the light-emitting diode ED.

The outer surface of the insulating film 38 may be subjected to a surface treatment. The light-emitting diodes ED may be dispersed in an ink, and the ink may be sprayed onto the electrode. In doing so, a surface treatment may be applied to the insulating film 38 so that it becomes hydrophobic or hydrophilic in order to keep the light-emitting diodes ED dispersed in the ink from being aggregated with one another.

As described above, in the display device 10 according to an embodiment, connection electrodes CNE may be sorted or divided into the connection electrodes of the different connection electrode layers CNE #1 and CNE #2 depending on whether the connection electrodes CNE are disposed on the second insulating layer PAS2 or the third insulating layer PAS3. In an embodiment, the connection electrodes disposed on the same connection electrode layers CNE #1 and CNE #2 may electrically contact a same one of both sides of the light-emitting diodes ED. By virtue of such an arrangement of the connection electrodes CNE, even if the patterns of the second insulating layer PAS2 and the third insulating layer PAS3 are shifted during the process of fabricating the display device 10, the patterns of the connection electrodes CNE may also be shifted. Therefore, there is an advantage that it is possible to cope with misalignment of the overlay patterns.

Figure 10:
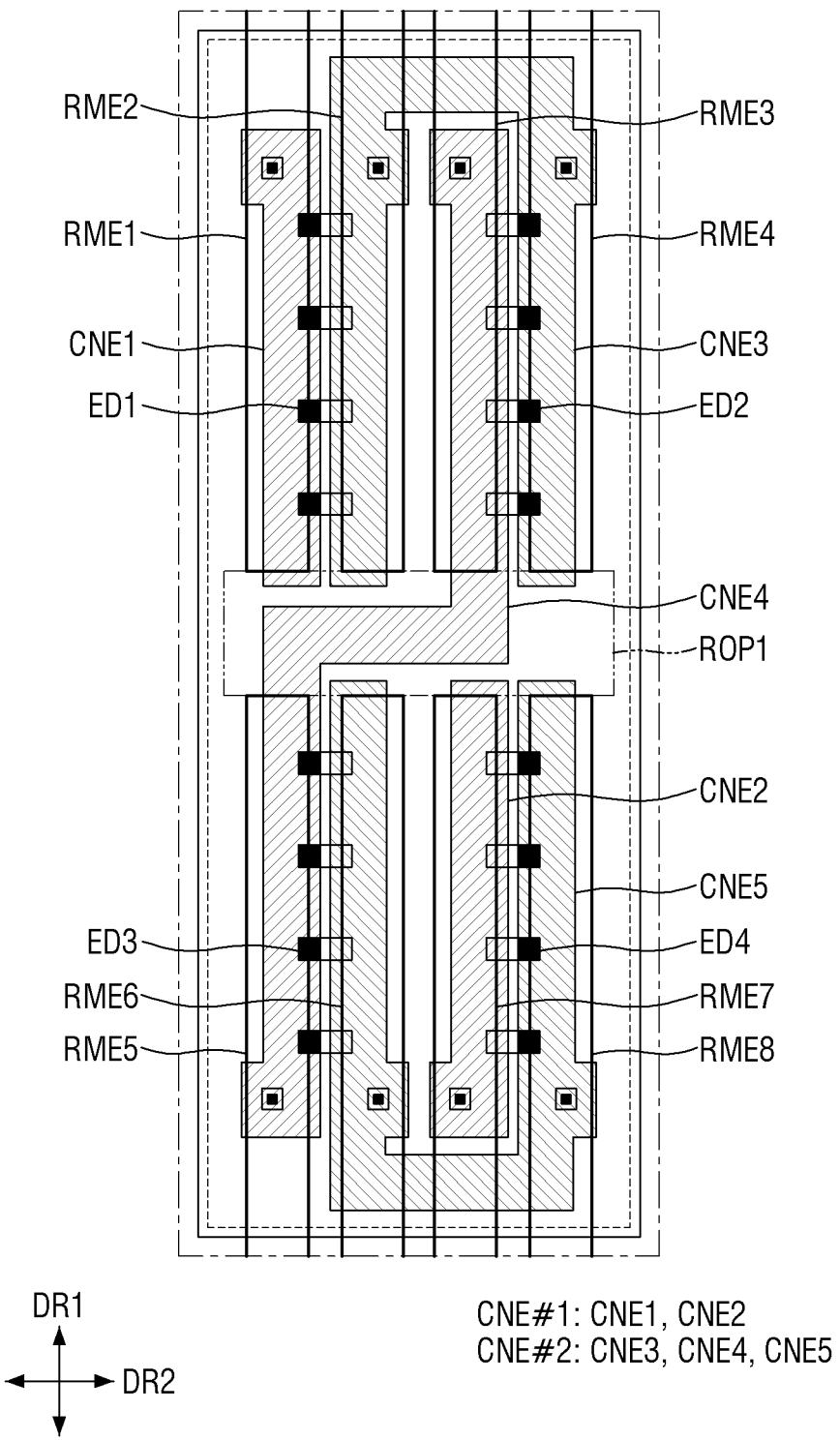
FIG. 10 is a schematic plan view showing an arrangement of connection electrodes and light-emitting diodes of a display device according to an embodiment.

FIG. 10 is a schematic plan view illustrating an arrangement of connection electrodes and light-emitting diodes of a display device according to an embodiment. FIG. 10 illustrates a relative arrangement of electrodes RME, light-emitting diodes ED, and connection electrodes CNE disposed in the emission area EMA of a sub-pixel PXn.

Referring to FIGS. 3 to 9 and 10, the first connection electrode CNE1, the second connection electrode CNE2, and the fourth connection electrode CNE4 may be disposed on the third insulating layer PAS3 as the connection electrodes CNE of the first connection electrode layer CNE #1, while the third connection electrode CNE3 and the fifth connection electrode CNE5 may be disposed between the second insulating layer PAS2 and the third insulating layer PAS3 as the connection electrodes CNE of the second connection electrode layer CNE #2.

The positions at which the connection electrodes CNE are disposed may be associated with the pattern shapes and positions of the second insulating layer PAS2 and the third insulating layer PAS3. The second insulating layer PAS2 and the third insulating layer PAS3 may be formed by disposing them entirely on the first insulating layer PAS1 and partially removing them to expose a side and the opposite side of each of the light-emitting diodes ED. The connection electrodes CNE may be disposed in portions where the second insulating layer PAS2 and the third insulating layer PAS3 are not disposed and thus they are exposed so that they may electrically contact the one side or the opposite side of each of the light-emitting diodes ED.

In an embodiment, the connection electrodes CNE of the same connection electrode layers CNE #1 or CNE #2 may electrically contact a same one of both sides of the light-emitting diodes ED in the display device 10. The first connection electrode CNE1, the second connection electrode CNE2, and the fourth connection electrode CNE4 of the first connection electrode layer CNE #1 may electrically contact the one side of each of the light-emitting diodes ED, and the third connection electrode CNE3 and the fifth connection electrode CNE5 of the second connection electrode layer CNE #2 may electrically contact the opposite side of each of the light-emitting diodes ED. In particular, the third connection electrode CNE3, the fourth connection electrode CNE4, and the fifth connection electrode CNE5 each may be disposed across the electrodes RME and may electrically contact only a same one of the one side and the opposite side of each of the different light-emitting diodes ED.

The connection electrodes CNE of the same connection electrode layers CNE #1 or CNE #2 may be arranged parallel to one another in the first direction DR1. For example, the first connection electrode CNE1 may be disposed in parallel with a fourth extended portion CN_E4 of a fourth connection electrode CNE4 in the first direction DR1, and the second connection electrode CNE2 may be disposed in parallel with a third extended portion CN_E3 of the fourth connection electrode CNE4 in the first direction DR1. A first extended portion CN_E1 and a second extended portion CN_E2 of the third connection electrode CNE3 and a fifth extended portion CN_E5 and a sixth extended portion CN_E6 of the fifth connection electrode CNE5 may be arranged side-by-side in the first direction DR1.

During the process of forming the second insulating layer PAS2 and the third insulating layer PAS3, a process of patterning the material of the insulating layers may be performed so that one side and the opposite side of each of the light-emitting diodes ED are exposed. The patterning process may be a process of removing the material of the insulating layers, and the position for the patterning process may be determined based on the overlay design of a mask pattern. The display device 10 may be designed such that the connection electrodes CNE of the same connection electrode layer CNE #1 or CNE #2 electrically contact the same one of both sides of each of the light-emitting diodes ED, and the mask pattern of each of the layers used in the process of forming the second insulating layer PAS2 and the third insulating layer PAS3 may also expose the same ones or the others of both sides of each of the light-emitting diodes ED.

For example, the process of forming the second insulating layer PAS2 may expose the opposite side (or second side) of each of the light-emitting diodes ED, and the process of forming the third insulating layer PAS3 may expose the one side of each of the light-emitting diodes ED. One side (or first side) of each of the light-emitting diodes ED may be covered or overlapped by the material of the second insulating layer PAS2 before the third insulating layer PAS3 is formed, and the one side may be exposed as the material of the second insulating layer PAS2 is removed together during the process of forming the third insulating layer PAS3. For example, during the process of forming the second insulating layer PAS2, the opposite side (or second side) of each of the light-emitting diodes ED may be commonly exposed, and the one side thereof may be commonly exposed during the process of forming the third insulating layer PAS3.

In doing so, if a mask pattern for forming an insulating layer is misaligned because it deviates from the overlay design values with the underlying layer, the position where the material of the insulating layer has to be removed may be different from the design values. In the display device 10 according to an embodiment, the same side of each of the light-emitting diodes ED may be exposed during the process of forming the insulating layer, and thus it is easy to compensate for the misalignment of the patterns. If first sides of some of the light-emitting diodes ED are not exposed as according to the design values because of the misalignment of the mask pattern, the first sides of the other light-emitting diodes ED may not be exposed. The mask pattern may be aligned again, or an additional patterning process may be carried out, in order to expose the first sides of the light-emitting diodes ED as designed.

Similarly, in a process of forming the connection electrodes CNE performed after the process of patterning the insulating layers, the positions where the connection electrodes CNE are to be formed may be determined based on the overlay design of the mask pattern. In case that the second sides of the light-emitting diodes ED are exposed during the process of forming the second insulating layer PAS2, the connection electrodes CNE of the second connection electrode layer CNE #2 may be formed. In case that the first sides of the light-emitting diodes ED are exposed during the process of forming the third insulating layer PAS3, the connection electrodes CNE of the first connection electrode layer CNE #1 may be formed.

Even if the mask pattern exposing the first side or the second side of each of the light-emitting diodes ED is misaligned, the process may be performed by shifting the mask pattern forming the first connection electrode layer CNE #1 and the second connection electrode layer CNE #2, as much as the mask pattern has been shifted. The connection electrodes CNE electrically contacting first sides of the light-emitting diodes ED may also be shifted in a same direction as much as the mask pattern exposing the first sides of the light-emitting diodes ED has been shifted in a same direction.

In particular, each of the third connection electrode CNE3, the fourth connection electrode CNE4, and the fifth connection electrode CNE5 may be disposed across electrodes RME and electrically contact different light-emitting diodes ED. The third connection electrode CNE3, the fourth connection electrode CNE4, and the fifth connection electrode CNE5 may electrically contact only the same ones of the others of both sides of the different light-emitting diodes, and thus it is possible to avoid the problem that only one of the different light-emitting diodes ED electrically contacts the connection electrodes CNE but not the other connection electrodes CNE. Even if the connection electrodes CNE disposed across the electrodes RME are shifted during the overlay alignment, the first to sixth extended portions CN_E1, CN_E2, CN_E3, CN_E4, CN_E5, and CN_E6 of the connection electrodes CNE may be moved in a same direction. Accordingly, the distances with the other connection electrodes CNE or the first to sixth extended portions CN_E1, CN_E2, CN_E3, CN_E4, CN_E5, and CN_E6 may be maintained.

In an embodiment, the pattern of the insulating layer exposing both sides of the light-emitting diodes ED and the arrangement of the connection electrodes CNE in the display device 10 may be designed so that the patterns on a same layer are in line with the same ones of the both sides of the light-emitting diodes ED. It is possible to cope with the misalignment of the overlay design by shifting the pattern of the insulating layer and the arrangement of the connection electrodes CNE in a same direction during the process of fabricating the display device 10. It is possible to prevent contact failure between the connection electrodes CNE and the light-emitting diodes ED and a short-circuit between the connection electrodes CNE.

As described above, each of the light-emitting diodes ED may include the first semiconductor layer 31 and the second semiconductor layer 32 doped with impurities of different conductivity types, so that one end thereof may be oriented in a particular direction by the electric field. The first end and the second end of each of the light-emitting diodes ED may be distinguished based on the position where the first semiconductor layer 31 or the second semiconductor layer 32 is disposed.

According to an embodiment, the end of the light-emitting diode ED that is adjacent to the second semiconductor layer 32 may be defined as the first end, while the opposite end of the light-emitting diode ED where the first semiconductor layer 31 is positioned may be defined as the second end. As described above, the first end of each of the first light-emitting diodes ED1 may be disposed on the first electrode RME1 while the second end thereof may be disposed on the second electrode RME2. The first end of each of the third light-emitting diodes ED3 may be disposed on the fifth electrode RME5 while the second end thereof may be disposed on the sixth electrode RME6. On the other hand, the first end of each of the second light-emitting diodes ED2 may be disposed on the fourth electrode RME4 while the second end thereof may be disposed on the third electrode RME3. The first end of each of the fourth light-emitting diodes ED4 may be disposed on the eighth electrode RME8 while the second end thereof may be disposed on the seventh electrode RME7. The first ends of the first light-emitting diodes ED1 and the third light-emitting diodes ED3 may face one side in the second direction DR2, whereas the first ends of the second light-emitting diodes ED2 and the fourth light-emitting diodes ED4 may face the opposite side in the second direction DR2. For example, some of the light-emitting diodes ED may be oriented such that their first ends face in the opposite direction to those of the other light-emitting diodes ED.

The direction in which the first ends of the light-emitting diodes ED face may vary according to an alignment signal applied to the electrodes RME or the electrode line. The electrodes RME spaced apart from one another in the first direction DR1 may be formed as a single electrode line during the process of fabricating the display device 10, and a same alignment signal may be applied to them. For example, the first electrode RME1 and the fifth electrode RME5 may be formed as a single electrode line, and the second electrode RME2 and the sixth electrode RME6 may be formed as a single electrode line. Different alignment signals may be applied to the electrode lines adjacent to one another in the second direction DR2. The light-emitting diodes ED may be arranged by the electric field generated by the alignment signals so that their first ends face an electrode line or the electrodes RME. A same alignment signal may be applied to the electrode line formed by the second electrode RME2 and the sixth electrode RME6 and to the electrode line formed by the third electrode RME3 and the seventh electrode RME7. An alignment signal applied to the electrode line formed by the third electrode RME3 and the seventh electrode RME7 may be different from an alignment signal applied to the electrode line formed by the fourth and eighth electrodes RME4 and RME8. Accordingly, the first light-emitting diodes ED1 disposed on the first electrode RME1 and the second electrode RME2 and the second light-emitting diodes ED2 disposed on the third electrode RME3 and the fourth electrode RME4 may be oriented so that their first ends face in opposite directions.

The first ends of the first light-emitting diodes ED1 may be electrically connected to the first electrode RME1 through the first connection electrode CNE1. The second ends of the first light-emitting diodes ED1 may be electrically connected to the first ends of the second light-emitting diodes ED2 through the third connection electrode CNE3. The second ends of the second light-emitting diodes ED2 may be electrically connected to the first ends of the third light-emitting diodes ED3 through the fourth connection electrode CNE4, and the second ends of the third light-emitting diodes ED3 may be electrically connected to the first ends of the fourth light-emitting diodes ED4. The second ends of the fourth light-emitting diodes ED4 may be electrically connected to the seventh electrode RME7 through the second connection electrode CNE2. The direction in which the first ends and the second ends of the light-emitting diodes ED face may be defined. The first ends and the second ends of the different light-emitting diodes ED may be electrically connected with one another through a connection electrode CNE. The light-emitting diodes ED having the first end and the second end electrically connected to each other may form an electrical serial connection.

Although FIG. 10 illustrates the first ends of the different light-emitting diodes ED are oriented uniformly, the disclosure is not limited thereto. In some embodiments, the first ends of some of the light-emitting diodes ED disposed on same electrodes RME may face in different directions. Only some of the light-emitting diodes ED may have a forward connection through the connection electrodes CNE, and others of them may have no forward connection and may emit no light. Detailed descriptions thereof will be given with reference to another embodiment(s).

Hereinafter, display devices according to a variety of embodiments will be described with reference to other drawings.

Figure 11:
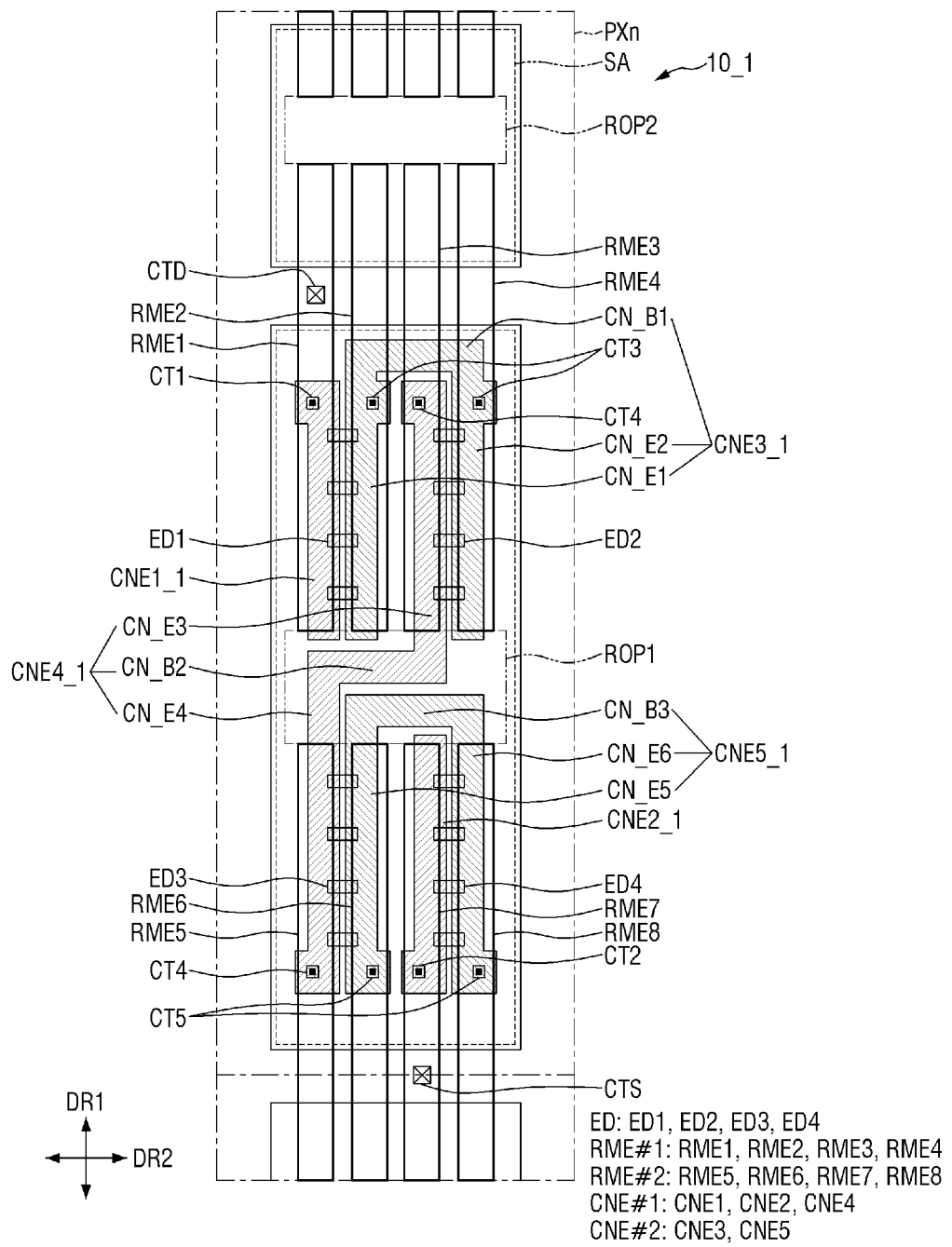
FIG. 11 is a schematic plan view showing a relative arrangement of electrodes and connection electrodes disposed in a sub-pixel of a display device according to another embodiment.

FIG. 11 is a schematic plan view illustrating a relative arrangement of electrodes and connection electrodes disposed in a sub-pixel of a display device according to an embodiment. FIG. 11 illustrates a relative arrangement of electrodes RME, connection electrodes CNE, and light-emitting diodes ED disposed in a sub-pixel PXn of a display device 10_1.

Referring to FIG. 11, in the display device 10_1 according to the embodiment, a third bridge portion CN_B3 of a fifth connection electrode CNE5_1 may be disposed in a first separation portion ROP1 of the emission area EMA. The pattern shape of the display device 10_1 may be changed in a variety of ways as long as the connection electrodes CNE disposed on the same connection electrode layers CNE #1 and CNE #2 electrically contact the same one of both sides of each of the light-emitting diodes ED. As the third bridge portion CN_B3 of the fifth connection electrode CNE5_1 is disposed in the first separation portion ROP1 in the display device 10_1, a third connection electrode CNE3_1 and the fifth connection electrode CNE5_1 may have substantially a same pattern in a plan view.

Besides, the arrangement of a first connection electrode CNE1_1, a second connection electrode CNE2_1, and a fourth connection electrode CNE4_1 as the connection electrodes of the first connection electrode layer CNE #1 may be substantially identical to that the arrangement of the embodiment of FIG. 4. A second bridge portion CN_B2 of the fourth connection electrode CNE4_1 may be spaced apart from the third bridge portion CN_B3 of the fifth connection electrode CNE5_1 in the first direction DR1 in the first separation portion ROP.

The third connection electrode CNE3_1 and the fifth connection electrode CNE5_1 may be disposed on a same layer as the connection electrodes CNE of the second connection electrode layer CNE #2. As the third connection electrode CNE3_1 and the fifth connection electrode CNE5_1 are formed by a same process, their positions thereof may be moved in a same direction as the mask pattern is shifted. As the third connection electrode CNE3_1 and the fifth connection electrode CNE5_1 have a same shape in a plan view, a first bridge portion CN_B1 and the third bridge portion CN_B3 may be positioned on one side, for example, upper sides of the extended portions in the first direction DR1. Accordingly, the mask pattern of the third connection electrode CNE3_1 and the fifth connection electrode CNE5_1 may be shifted in a same direction not only in the second direction DR2 but also in the first direction DR1. For example, the display device 10_1 may cope with shifting of the third connection electrode CNE3_1 and the fifth connection electrode CNE5_1 in vertical and horizontal directions.

Figure 12:
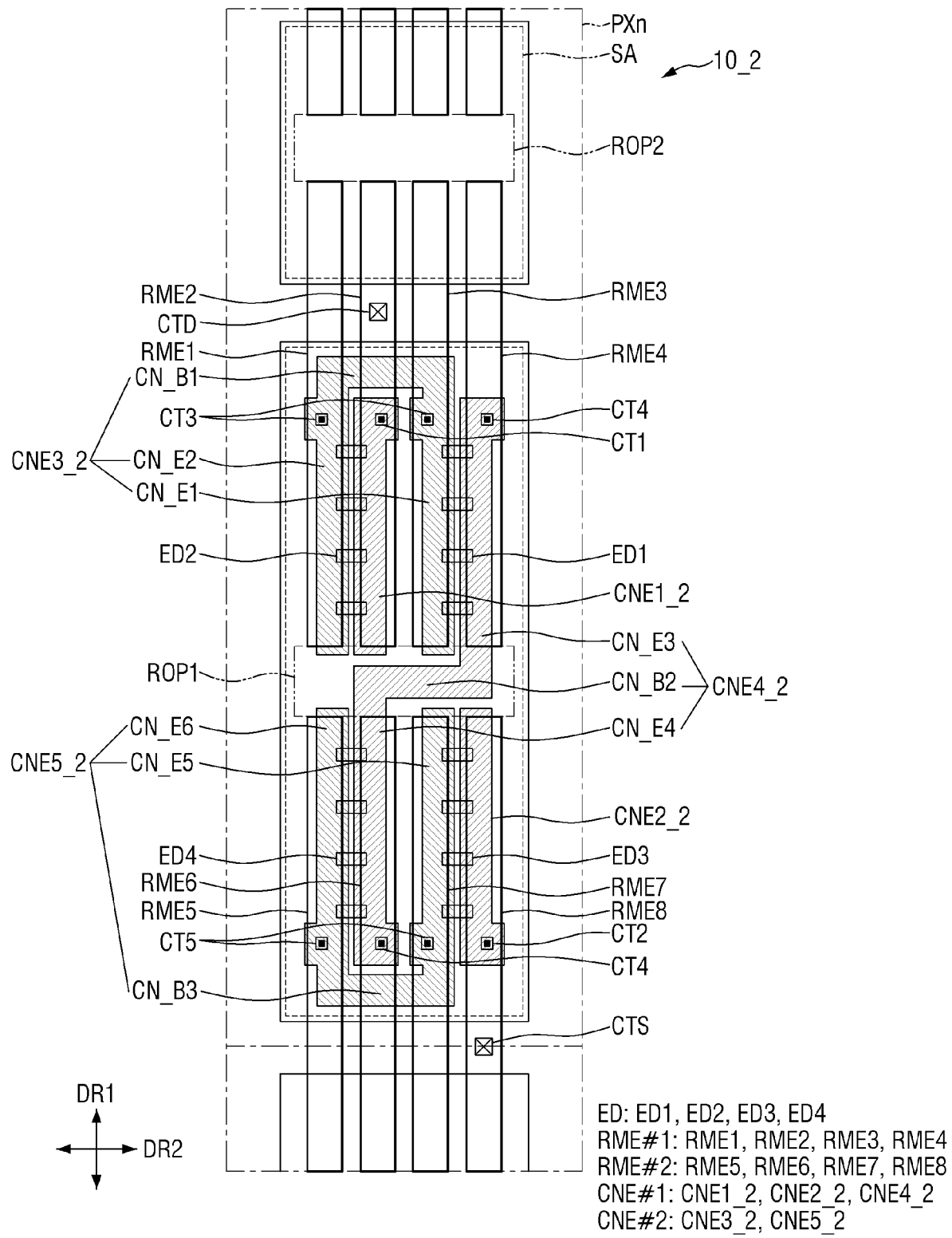
FIG. 12 is a schematic plan view showing a relative arrangement of electrodes and connection electrodes disposed in a sub-pixel of a display device according to another embodiment.

FIG. 12 is a schematic plan view illustrating a relative arrangement of electrodes and connection electrodes disposed in a sub-pixel of a display device according to an embodiment. FIG. 12 illustrates a relative arrangement of electrodes RME, connection electrodes CNE and light-emitting diodes ED disposed in a sub-pixel PXn of a display device 10_2.

Referring to FIG. 12, in the display device 10_2 according to the embodiment, first, second, and third connection electrodes CNE1_2, CNE2_2, and CNE3_2 of the first connection electrode layer CNE #1 may electrically contact the opposite sides (or second sides) of the light-emitting diodes ED, while the second connection electrode CNE3_2 and a fifth connection electrode CNE5_2 of the second connection electrode layer CNE #2 may electrically contact the first sides of the light-emitting diodes ED. Compared to the embodiment of FIG. 4, different electrodes RME may be disposed under the connection electrodes CNE, and a different electrode may be electrically connected directly to the third conductive layer, which is the electrode RME on which the first connection electrode CNE1_2 and the second connection electrode CNE2_2 are disposed as first type connection electrodes.

The first connection electrode CNE1_2 may be disposed on the second electrode RME2 to electrically contact the opposite side of each of the first light-emitting diodes ED1. The second electrode RME2 may be electrically connected directly to the second conductive pattern CDP2 thereunder through a first electrode contact hole CTD formed in a portion in which the second electrode RME2 overlaps the third bank BNL3. The second connection electrode CNE2_2 may be disposed on the eighth electrode RME8 to contact the opposite side of each of the fourth light-emitting diodes ED4. The eighth electrode RME8 may be electrically connected directly to a second voltage line VL2 thereunder through a second electrode contact hole CTS formed in a portion in which the eighth electrode RME8 overlaps the third bank BNL3. Different electrodes may be electrically connected directly to the third conductive layer in the display device 10_2 depending on the arrangement of the connection electrodes CNE.

The third connection electrode CNE3_2 may be disposed on the first electrode RME1 and the third electrode RME3 and may electrically contact the first sides of the first light-emitting diodes ED1 and the first sides of the second light-emitting diodes ED2. A fourth connection electrode CNE4_2 may be disposed on the fourth electrode RME4 and the eighth electrode RME8 to electrically contact the second sides (or opposite sides) of the second light-emitting diodes ED2 and the second sides of the third light-emitting diodes ED3. The fifth connection electrode CNE5_2 may be disposed on the fifth electrode RME5 and the seventh electrode RME7 to electrically contact the first sides of the third light-emitting diodes ED3 and the first sides of the fourth light-emitting diodes ED4.

Even though different connection electrodes CNE electrically contact the one side and the opposite side of each of the light-emitting diodes ED, the first end and the second end thereof may still electrically contact the same connection electrodes CNE, respectively. For example, for the first light-emitting diode ED1, the opposite side disposed on the second electrode RME2 may be the first end, and the first end may electrically contact the first connection electrode CNE1_2. The second end of the first light-emitting diode ED1 may be disposed on the first electrode RME1, and the first end may face the opposite side in the second direction DR2.

Similarly, for the second light-emitting diode ED2, the first end may be disposed on the third electrode RME3, and the second end may be disposed on the fourth electrode RME4. The first end of the third light-emitting diode ED3 may be disposed on the sixth electrode RME6, and the second end thereof may be disposed on the fifth electrode RME5. The first end of the fourth light-emitting diode ED4 may be disposed on the seventh electrode RME7, and the second end thereof may be disposed on the eighth electrode RME8.

While the one side and the opposite side of each of the light-emitting diodes ED are determined based on the second direction DR2 in a plan view, the first and second ends of each of the light-emitting diodes ED may be disposed in consideration of an electrical connection with the third conductive layer thereunder. The first end of the first light-emitting diode ED1 may be disposed on an electrode electrically connected to the first transistor T1, for example, on the second electrode RME2 through the first electrode contact hole CTD, while the second end of the fourth light-emitting diode ED4 may be disposed on an electrode electrically connected to the second voltage line VL2, for example, on the eighth electrode RME8 through the second electrode contact hole CTS.

The direction in which the first ends of the light-emitting diodes ED face may be determined by the alignment signal applied to the electrode line during the fabricating process, taking into account the connection with the third conductive layer thereunder. In the display device 10_2 according to this embodiment, the arrangement of connection electrodes CNE as well as the direction in which the first ends of the light-emitting diodes ED face may be changed, compared to the embodiment of FIG. 4. In the display device 10_2, even though the connection electrodes CNE of the connection electrode layers CNE #1 and CNE #2 are disposed at different positions, the direction in which the first ends of the light-emitting diodes ED face may be changed accordingly, and thus it is possible to maintain the serial connection between the light-emitting diodes ED.

Figure 13:
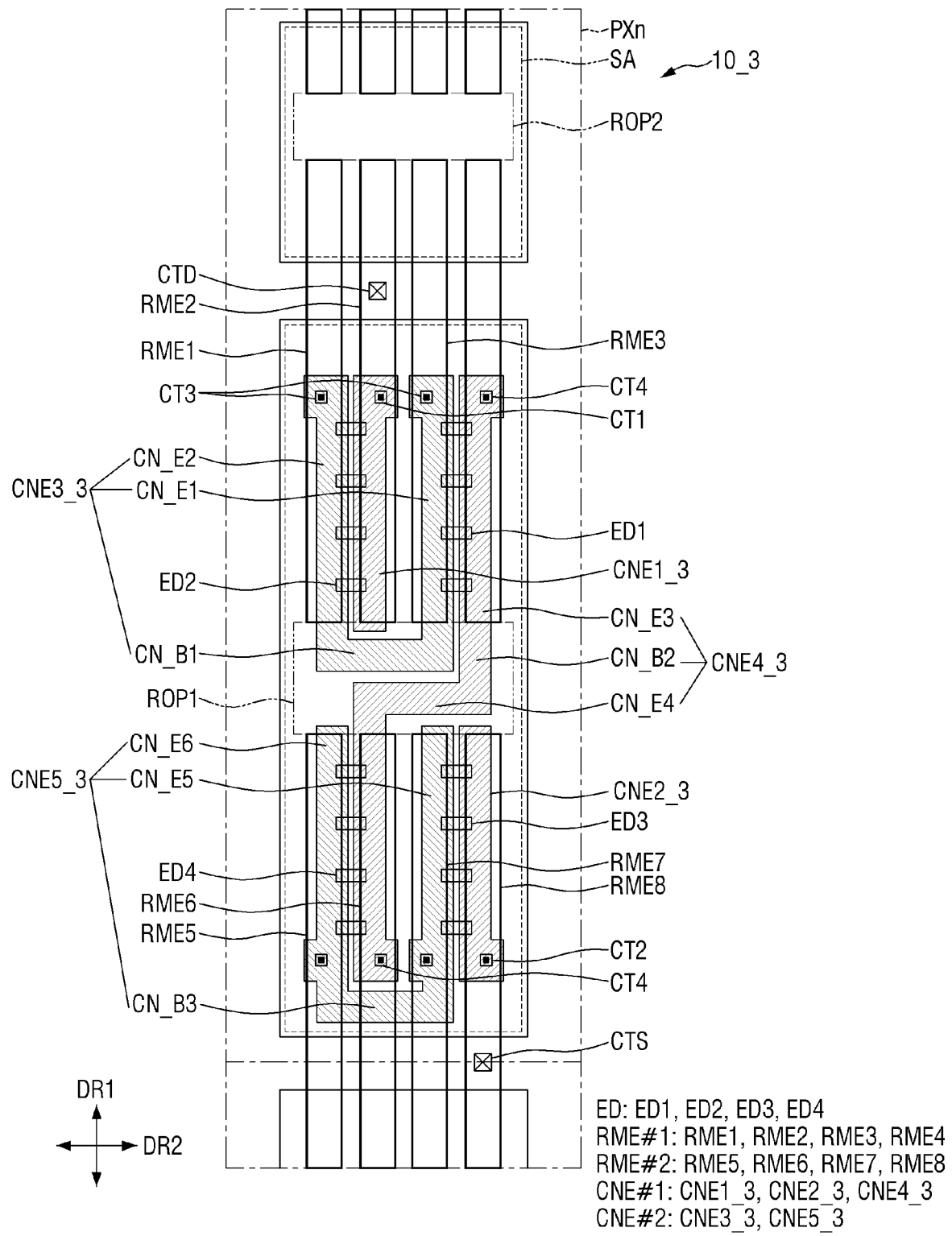
FIG. 13 is a schematic plan view showing a relative arrangement of electrodes and connection electrodes disposed in a sub-pixel of a display device according to another embodiment.

FIG. 13 is a schematic plan view illustrating a relative arrangement of electrodes and connection electrodes disposed in a sub-pixel of a display device according to an embodiment.

Referring to FIG. 13, in a display device 10_3 according to the embodiment, a first bridge portion CN_B1 of a third connection electrode CNE3_3 may be disposed in a first separation portion ROP1 of the emission area EMA. The display device 10_3 according to this embodiment may be different from the display device according to the embodiment of FIG. 12 at least in that the third connection electrode CNE3_3 has a different pattern shape in a plan view. As described above with reference to FIG. 11, the first bridge portion CN_B1 of the third connection electrode CNE3_3 may be disposed in the first separation portion ROP1, and thus the third connection electrode CNE3_3 and a fifth connection electrode CNE5_3 may have a same shape in a plan view. During the process of forming the second connection electrode layer CNE #2, the mask pattern of the third connection electrode CNE3_3 and the fifth connection electrode CNE5_3 may cope with shifting in vertical and horizontal directions. The arrangement of a first connection electrode CNE1_3, a second connection electrode CNE2_3, and a fourth connection electrode CNE4_3 as the first connection electrode layer CNE #1 may be identical to that of the embodiment of FIG. 12. Therefore, detailed descriptions thereof will be omitted.

Figure 14:
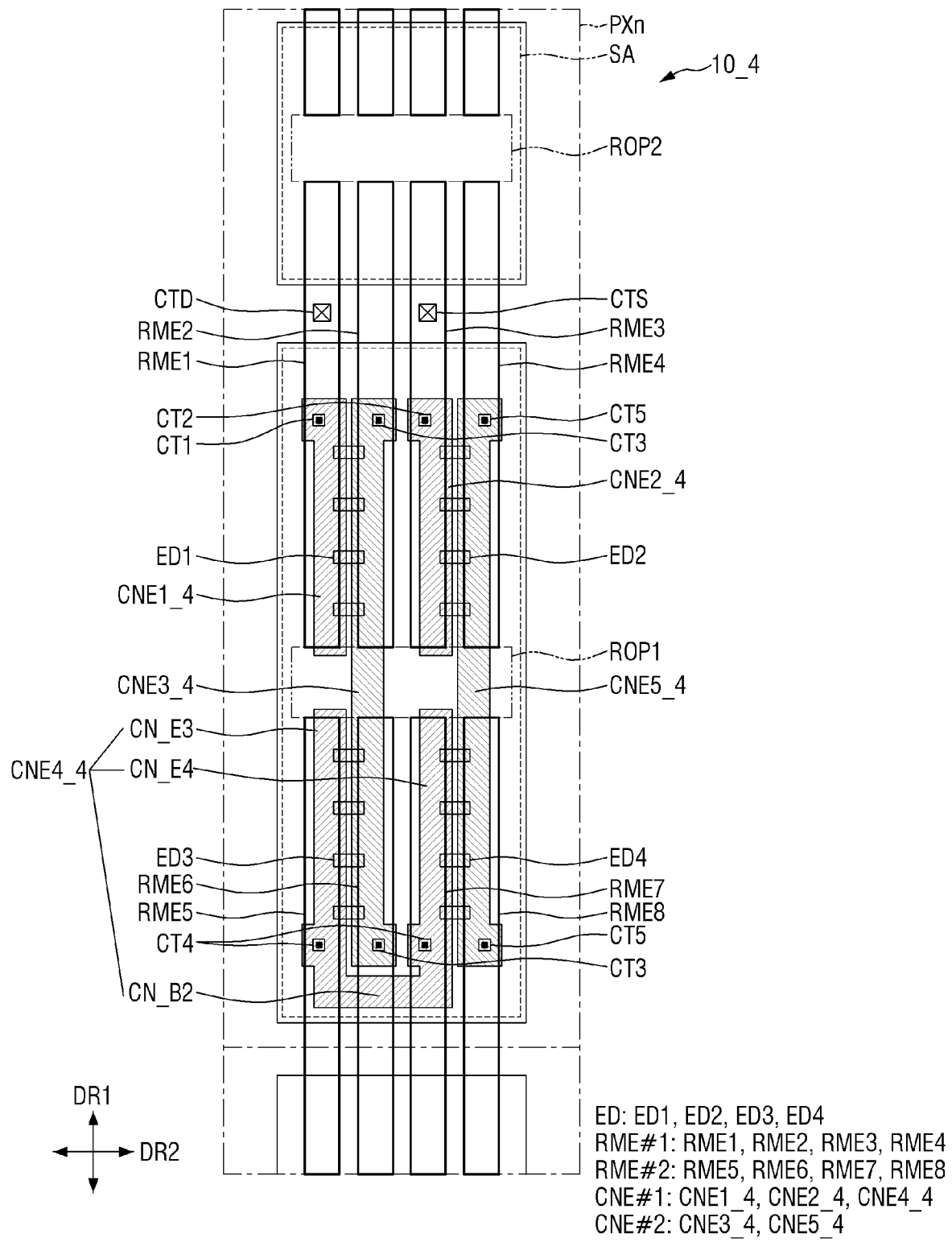
FIG. 14 is a schematic plan view showing a relative arrangement of electrodes and connection electrodes disposed in a sub-pixel of a display device according to another embodiment.

FIG. 14 is a schematic plan view illustrating a relative arrangement of electrodes and connection electrodes disposed in a sub-pixel of a display device according to an embodiment.

Referring to FIG. 14, in a display device 10_4 according to the embodiment, the connection electrodes CNE of the second connection electrode layer CNE #2 may be extended in a direction, and a fourth connection electrode CNE4_4 may be disposed in a shape that partially surrounds at least one of the connection electrodes CNE of the second connection electrode layer CNE #2. In this embodiment, the pattern shapes of some of the connection electrodes CNE in a plan view may be different, and the connection structure between the connection electrodes CNE and the electrodes RME and between the electrodes RME and the third conductive layer may be different.

A first connection electrode CNE1_4 may be disposed on the first electrode RME1 to electrically contact the one side of each of the first light-emitting diodes ED1. The first electrode RME1 may be electrically connected directly to the second conductive pattern CDP2 thereunder through a first electrode contact hole CTD. A second connection electrode CNE2_4 may be disposed on the third electrode RME3 to electrically contact the one side of each of the second light-emitting diodes ED2. The third electrode RME3 may be electrically connected directly to a second voltage line VL2 thereunder through a second electrode contact hole CTS.

A third connection electrode CNE3_4 may be extended in the first direction DR1 and may be disposed on the second electrode RME2 and the sixth electrode RME6. The third connection electrode CNE3_4 may electrically contact the second sides (or opposite sides) of the first light-emitting diodes ED1 and the opposite sides of the third light-emitting diodes ED3. The third connection electrode CNE3_4 may electrically contact the second electrode RME2 and the sixth electrode RME6 through the third contact parts CT3.

The fourth connection electrode CNE4_4 may have a shape similar to that of the fifth connection electrode CNE5 of FIG. 4 in a plan view. A third extended portion CN_E3 of the fourth connection electrode CNE4_4 may be disposed on the fifth electrode RME5, and a fourth extended portion CN_E4 thereof may be disposed on the seventh electrode RME7. The second bridge portion CN_B2 may be spaced apart from the first separation part ROP1 in the first direction DR1. The fourth connection electrode CNE4_4 may electrically contact the one side of each of the third light-emitting diodes ED3 and the one side of each of the fourth light-emitting diodes ED4. The fourth connection electrode CNE4_4 may electrically contact the fifth electrode RME5 and the seventh electrode RME7 through the fourth contact parts CT4.

A fifth connection electrode CNE5_4 may be extended in the first direction DR1 and may be disposed on the fourth electrode RME4 and the eighth electrode RME8. The fifth connection electrode CNE5_4 may electrically contact the opposite sides (or second sides) of the second light-emitting diodes ED2 and the opposite sides of the fifth light-emitting diodes ED5. The fifth connection electrode CNE5_4 may electrically contact the fourth electrode RME4 and the eighth electrode RME8 through the fifth contact parts CT5.

The first connection electrode CNE1_4, the second connection electrode CNE2_4, the third connection electrode CNE3_4, and the fifth connection electrode CNE5_4 may each have a shape extended in the first direction DR1. The first connection electrode CNE1_4 and the second connection electrode CNE2_4 may be disposed on only an electrode RME, while the third connection electrode CNE3_4 and the fifth connection electrode CNE5_4 may be disposed on electrodes RME. In an embodiment, the lengths of the first connection electrode CNE14 and the second connection electrode CNE2_4 extended in the first direction DR1 may be smaller than the lengths of the third connection electrode CNE3_4 and the fifth connection electrode CNE5_4 extended in the direction DR1.

Even if the pattern shape of the connection electrodes CNE of the second connection electrode layer CNE #2 is changed in a plan view, the connection electrodes CNE of the same connection electrode layers CNE #1 and CNE #2 may electrically contact the same one of both sides of the light-emitting diodes ED. In particular, as the third connection electrode CNE3_4 and the fifth connection electrode CNE5_4 have a shape extended in a direction, it is easy to cope with shifting of the mask pattern in the second direction DR2.

Unlike the above embodiments, the connection electrodes CNE may have an arrangement independent of the direction in which the first ends of the light-emitting diodes ED face. In the display device 10_4, the first ends may face in different directions even among the light-emitting diodes ED having both ends disposed on the same electrode RME.

Figure 15:
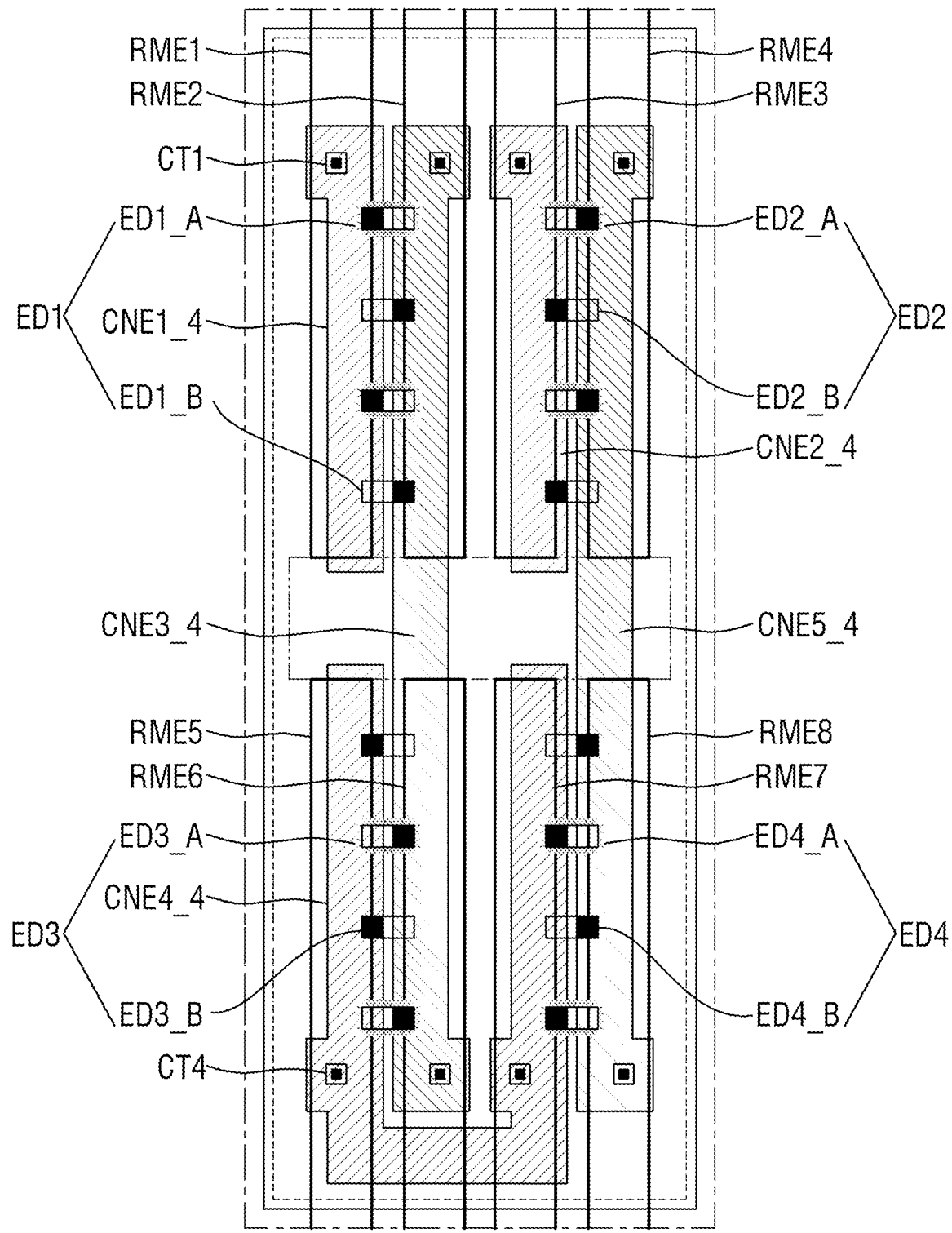
FIG. 15 is a schematic plan view showing an arrangement of light-emitting diodes elements disposed on different electrode groups in the display device of FIG. 14.

FIG. 15 is a schematic plan view illustrating an arrangement of light-emitting diodes elements disposed on different electrode groups in the display device of FIG. 14.

Referring to FIGS. 14 and 15, the light-emitting diodes ED (e.g., ED1, ED2, ED3 and ED4) may be sorted or divided into different light-emitting diodes depending on the direction in which their first ends face. For example, the first light-emitting diodes ED1 may include a first type light-emitting diode ED1_A having a first end disposed on the first electrode RME1 electrically to contact the first connection electrode CNE1_4 and a second type light-emitting diode ED1_B having a first end disposed on the second electrode RME2 to electrically contact the third connection electrode CNE3_4. The first end of the first type light-emitting diode ED1_A may face in an opposite direction to the first end of the second type light-emitting diode ED1_B.

Similarly, the second light-emitting diodes ED2 may include a first type light-emitting diode ED2_A having a first end disposed on the fourth electrode RME4 to electrically contact the fifth connection electrode CNE5_4 and a second type light-emitting diode ED2_B having a first end disposed on the third electrode RME3 to electrically contact the second connection electrode CNE2_4. The third light-emitting diodes ED3 may include a first type light-emitting diode ED3_A having a first end disposed on the sixth electrode RME6 to electrically contact the third connection electrode CNE3_4 and a second type light-emitting diode ED3_B having a first end disposed on the fifth electrode RME5 to electrically contact the fourth connection electrode CNE4_4. The fourth light-emitting diodes ED4 may include a first type light-emitting diode ED4_A having a first end disposed on the seventh electrode RME7 to electrically contact the fourth connection electrode CNE4_4 and a second type light-emitting diode ED4_B having a first end disposed on the eighth electrode RME8 to electrically contact the fifth connection electrode CNE5_4.

The first end of the first type light-emitting diode ED1_A of the first light-emitting diode ED1 may be electrically connected to the first electrode RME1 through a first connection electrode CNE1_4, and the second end thereof may be electrically connected to the first type light-emitting diode ED3_A of the third light-emitting diodes ED3 through the third connection electrode CNE3_4. The second end of the first type light-emitting diode ED3_A of the third light-emitting diode ED3 may be electrically connected to the first end of the first type light-emitting diode ED4_A of the fourth light-emitting diode ED4 through the fourth connection electrode CNE4_4. The second end of the first type light-emitting diode ED4_A of the fourth light-emitting diode ED4 may be electrically connected to the first end of the first type light-emitting diode ED2_A of the second light-emitting diode ED2 through the fifth connection electrode CNE5_4. The first typical light-emitting diode ED2_A of the second light-emitting diode ED2 may be electrically connected to the third electrode RME3 through the second connection electrode CNE2_4.

The first type light-emitting diodes ED1_A, ED2_A, ED3_A, and ED4_A of the light-emitting diodes ED, for example, the first to fourth light-emitting diodes ED1, ED2, ED3, and ED4, may be electrically connected to each other in series by a forward connection, and each may emit light. On the other hand, the second-type light-emitting diodes ED1_B, ED2_B, ED3_B, and ED4_B of the light-emitting diodes ED (e.g., ED1, ED2, ED3, and ED4) may be electrically connected to each other in an opposite direction to the first type light-emitting diodes ED1_A, ED2_A, ED3_A, and ED4_A. For example, the second end of the second type light-emitting diode ED1_B of the first light-emitting diodes ED1 may be electrically connected to the first electrode RME1 through the first connection electrode CNE1_4 to form a reverse connection. For example, the second type light-emitting diodes ED1_B, ED2_B, ED3_B, and ED4_B of the light-emitting diodes ED (e.g., ED1, ED2, ED3 and ED4) may not emit light.

In the display device 10_4 according to this embodiment, some of the light-emitting diodes may emit light even if the first ends of the light-emitting diodes ED (e.g., ED1, ED2, ED3, and ED4) are not oriented in a uniform direction. During the process of fabricating the display device 10_4, the light-emitting diodes ED may be oriented by the electric field generated by the electrode line such that ends thereof face in a particular direction. The light-emitting diodes ED may not be oriented in a desired direction, and some of the light-emitting diodes ED may be oriented in an opposite direction. Even if the orientations of the light-emitting diodes ED are not uniform, at least some of the light-emitting diodes ED of the display device 10_4 may emit light by means of the arrangement and connection of the connection electrodes CNE. Specifically, each sub-pixel PXn of the display device 10_4 may emit light only if both ends of the light-emitting diodes ED are disposed on the electrodes RME regardless of the orientations of the light-emitting diodes ED.

Figure 16:
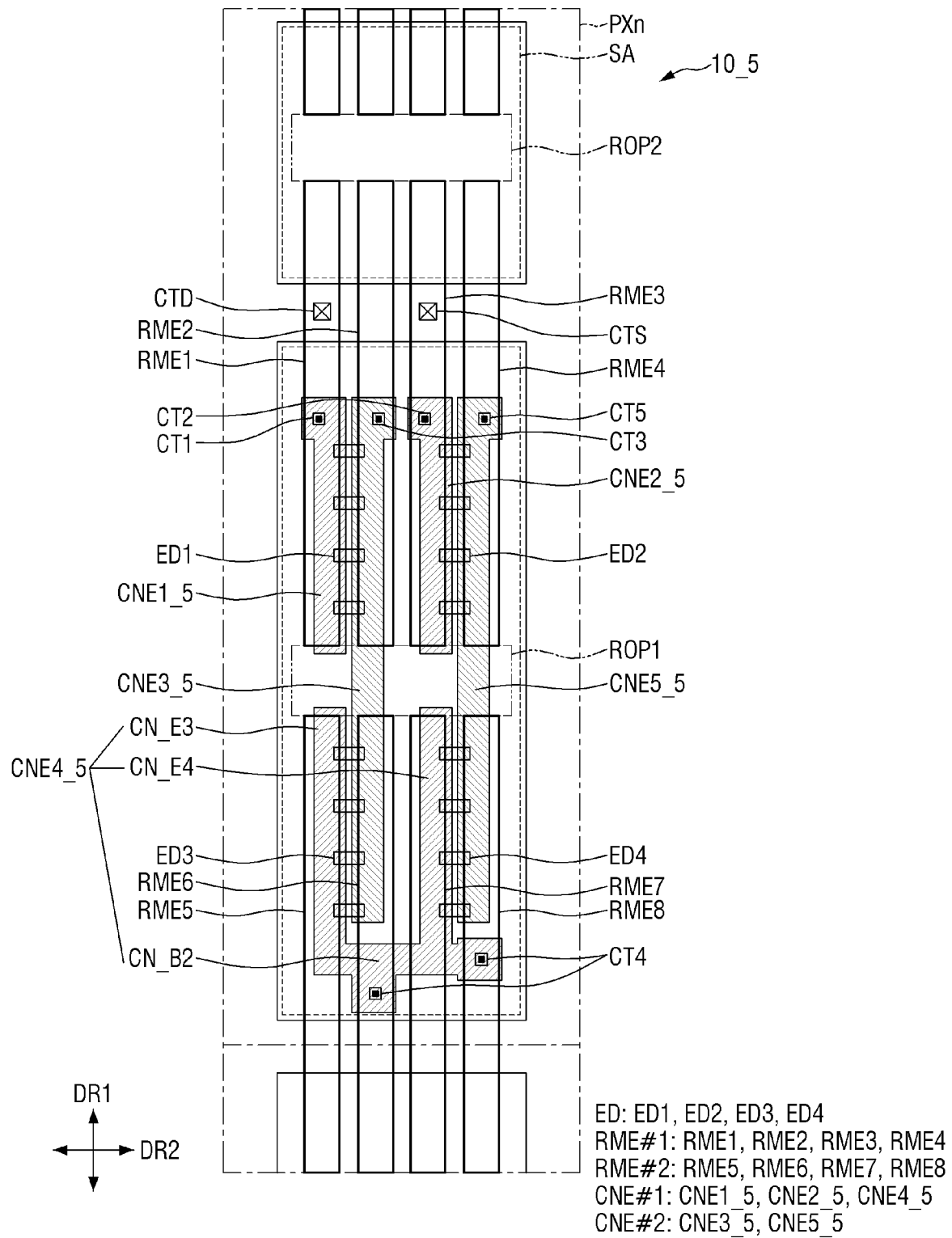
FIG. 16 is a schematic plan view showing a relative arrangement of electrodes and connection electrodes disposed in a sub-pixel of a display device according to another embodiment.

FIG. 16 is a schematic plan view illustrating a relative arrangement of electrodes and connection electrodes disposed in a sub-pixel of a display device according to an embodiment.

Referring to FIG. 16, in a display device 10_5 according to the embodiment, some contact parts may be removed, and a connection structure between the connection electrodes CNE and the electrodes RME may be altered. This embodiment may be different from that of FIG. 14 at least in that the arrangement of contact parts CT1, CT2, and CT4 is different.

The connection electrodes CNE may not be electrically connected to the other electrodes RME than the electrodes RME through which electric signal is transmitted from the third conductive layer thereunder. The light-emitting diodes ED may be electrically connected to electrodes electrically connected to the third conductive layer, e.g., to the first electrode RME1 and the third electrode RME3, and may not be electrically connected to some of the other electrodes RME.

A first connection electrode CNE1_5 and a second connection electrode CNE2_5 may electrically contact a first electrode RME1 and a third electrode RME3 through a first contact part CT1 and a second contact part CT2, respectively. The first light-emitting diodes ED1 and the second light-emitting diodes ED2 may be electrically connected to the first electrode RME1 and the third electrode RME3 through the first connection electrode CNE1_5 and the second connection electrode CNE2_5, respectively.

A third connection electrode CNE3_5 may be disposed across the second electrode RME2 and the sixth electrode RME6 and may electrically contact only the second electrode RME2 through the third contact part CT3. A fifth connection electrode CNE5_5 may be disposed across the fourth electrode RME4 and the eighth electrode RME8 and may electrically contact only the fourth electrode RME4 through the fifth contact part CT5. On the other hand, a third extended portion CN_E3 and a fourth extended portion CN_E4 of a fourth connection electrode CNE4_5 may be disposed on the fifth electrode RME5 and the seventh electrode RME7, respectively, but may not contact them. A second bridge portion CN_B2 of the fourth connection electrode CNE4_5 may be disposed on the sixth electrode RME6 and the eighth electrode RME8 and may electrically contact the sixth electrode RME6 and the eighth electrode RME8 through fourth contact parts CT4.

The fifth electrode RME5 and the seventh electrode RME7 may not be electrically connected to the third conductive layer thereunder and the connection electrodes CNE. The fifth electrode RME5 and the seventh electrode RME7 may be electrodes that are not electrically connected to the light-emitting diodes ED but remain in a floating state in the sub-pixel PXn. Although the light-emitting diodes ED are not electrically connected to the fifth electrode RME5 or the seventh electrode RME7, they may be electrically connected to each other in series through the connection electrodes CNE.

Figure 17:
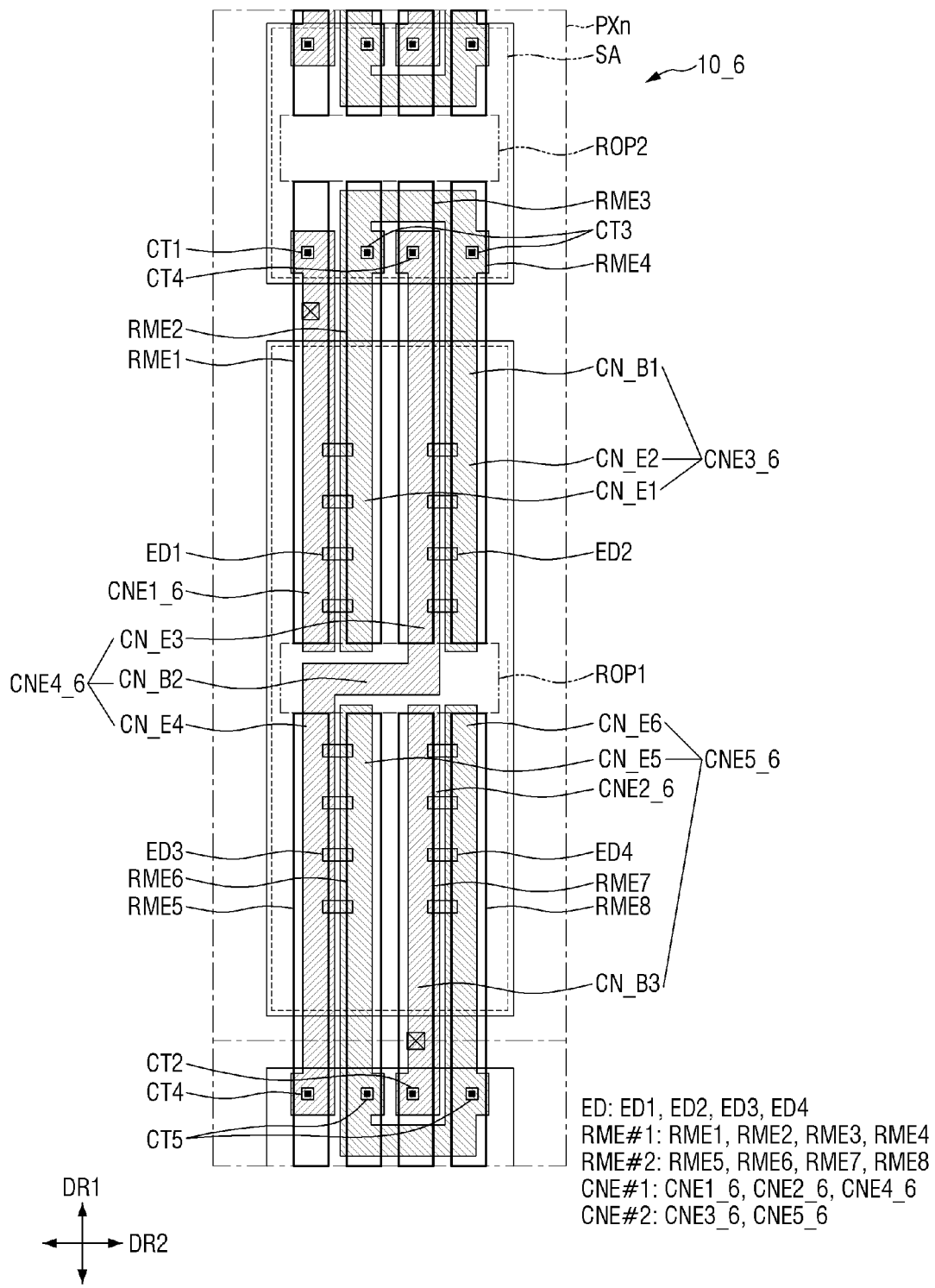
FIG. 17 is a schematic plan view showing a relative arrangement of electrodes and connection electrodes disposed in a sub-pixel of a display device according to another embodiment.

FIG. 17 is a schematic plan view illustrating a relative arrangement of electrodes and connection electrodes disposed in a sub-pixel of a display device according to another embodiment.

Referring to FIG. 17, in a display device 10_6, contact parts CT1, CT2, CT3, CT4, and CT5 through which the electrodes RME and the connection electrodes CNE are electrically connected may be formed at different positions. In an embodiment, the connection electrodes CNE of the display device 10_6 may be disposed across the emission area EMA and the sub-area SA, and the contact parts CT1, CT2, CT3, CT4, and CT5 may be positioned in the sub-area SA. This embodiment may be different from the embodiment of FIG. 4 at least in that the positions of the contact parts CT1, CT2, CT3, CT4, and CT5 and the shapes of the connection electrodes CNE are different.

A first connection electrode CNE1_6 and a second connection electrode CNE2_6 may be extended in the first direction DR1 and may be extended from the emission area EMA to a second separation portion ROP2 of the sub-area SA. The first connection electrode CNE1_6 may electrically contact the first electrode RME1 through the first contact part CT1 positioned in the sub-area SA of the sub-pixel PXn, and the second connection electrode CNE2_6 may contact the seventh electrode RME7 through the second contact part CT2 positioned in the sub-area SA of another sub-pixel PXn.

A first extended portion CN_E1 and a second extended portion CN_E2 of a third connection electrode CNE3_6 may be extended in the first direction DR1 from the emission area EMA to the second separation portion ROP2 of the sub-area SA, and a first bridge portion CN_B1 thereof may also be disposed in the sub-area SA. The third connection electrode CNE3_6 may contact the second electrode RME2 and the fourth electrode RME4 through third contact parts CT3 positioned in the sub-area SA.

The third extended portion CN_E3 and the fourth extended portion CN_E4 of a fourth connection electrode CNE4_6 may be further extended in the first direction DR1 from the emission area EMA to the second separation portion ROP2 of the sub-area SA. The fourth connection electrode CNE4_6 may electrically contact the third electrode RME3 and the fifth electrode RME5 through the fourth contact parts CT4 positioned in the sub-area SA.

A fifth extended portion CN_E5 and a sixth extended portion CN_E6 of a fifth connection electrode CNE5_6 may be further extended in the first direction DR1 from the emission area EMA to the second separation portion ROP2 of the sub-area SA, and a third bridge portion CN_B3 thereof may also be disposed in the sub-area SA. The fifth connection electrode CNE5_6 may electrically contact the sixth electrode RME6 and the eighth electrode RME8 through fifth contact parts CT5 positioned in the sub-area SA.

The second insulating layer PAS2 may be disposed entirely in the sub-area SA except for the second separation portion ROP2, and the third insulating layer PAS3 may be disposed entirely in the sub-area SA regardless of the second separation portion ROP2. Unlike the embodiment of FIG. 4, contact parts CT1, CT2, CT3, CT4, and CT5 may be disposed in the sub-area SA and may penetrate through the insulating layers disposed on the first insulating layer PAS1. For example, the first contact part CT1, the second contact part CT2, and the fourth contact part CT4 may penetrate through the second insulating layer PAS2 and the third insulating layer PAS3 in addition to the first insulating layer PAS1, and the third contact part CT3 and the fifth contact part CT5 may penetrate through the first insulating layer PAS1 and the second insulating layer PAS2.

The contact parts CT1, CT2, CT3, CT4, and CT5 may be formed in the sub-area SA out of the emission area EMA, and thus it is possible to avoid that the lights emitted from the light-emitting diodes ED are refracted at the contact parts CT1, CT2, CT3, CT4, and CT5 and thus cannot exit. It is also possible to prevent the light-emitting diodes ED from sticking together near the contact parts CT1, CT2, CT3, CT4, and CT5 exposing the upper surfaces of the electrodes RME during the process of fabricating the display device 10_6.

Figure 18:
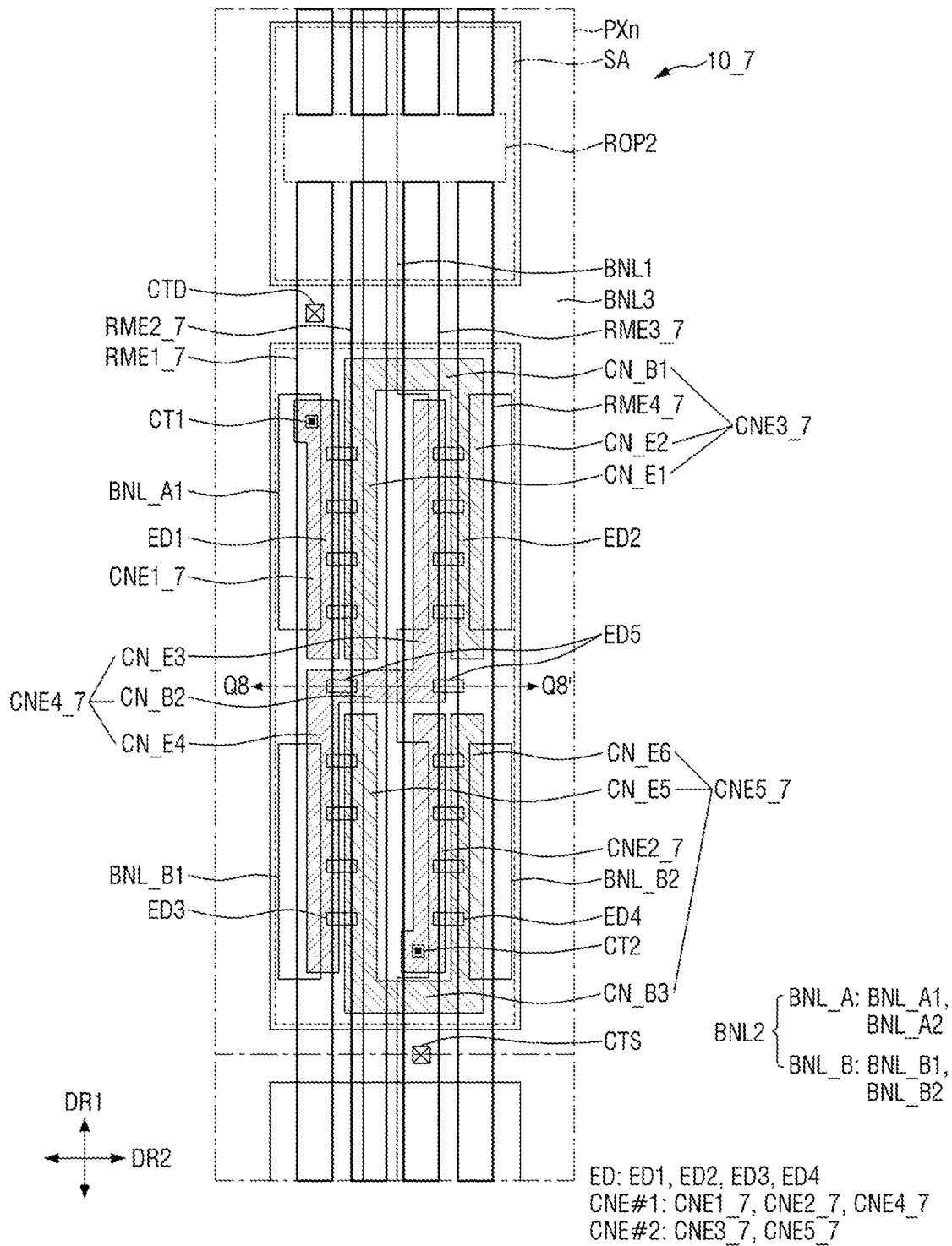
FIG. 18 is a schematic plan view showing a relative arrangement of electrodes and connection electrodes disposed in a sub-pixel of a display device according to another embodiment.
Figure 19:
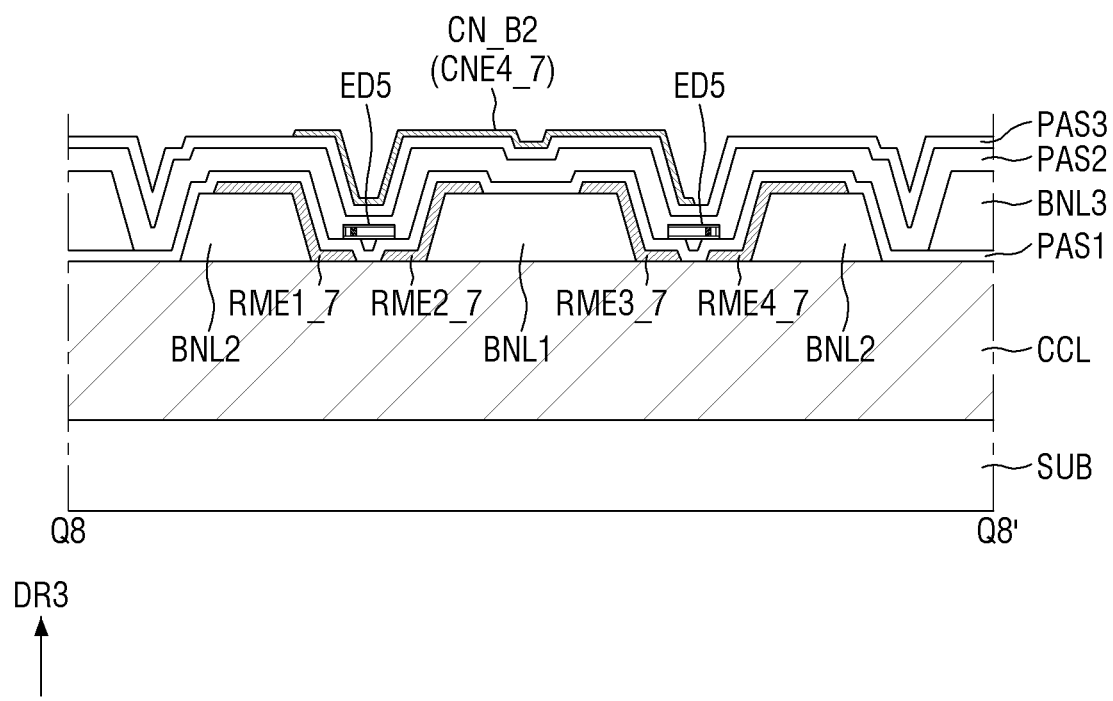
FIG. 19 is a schematic cross-sectional view taken along line Q8-Q8' of FIG. 18.

FIG. 18 is a schematic plan view illustrating a relative arrangement of electrodes and connection electrodes disposed in a sub-pixel of a display device according to an embodiment. FIG. 19 is a schematic cross-sectional view taken along line Q8-Q8' of FIG. 18.

Referring to FIGS. 18 and 19, in a display device 10_7 according to the embodiment, electrodes RME may not be sorted or divided into different electrode groups but may be extended in the first direction DR1 in the emission area EMA. The display device 10_7 according to this embodiment may be different from the display device according to the embodiment of FIG. 4 at least in that the electrodes RME has a different shape. Hereinafter, descriptions thereof will focus on the difference, and repetitive descriptions thereof will be omitted.

The electrodes RME may be extended in the first direction DR1 and may be disposed across the sub-area SA and the emission area EMA. Each of the electrodes RME may be extended from the sub-area SA of a sub-pixel PXn to the sub-area SA of another sub-pixel PXn adjacent to the sub-pixel PXn in the first direction DR1. In each sub-pixel PXn, the first separation portion ROP1 may be removed from the emission area EMA, and the electrodes RME may be disposed between the second separation portions ROP2 positioned in the respective sub-areas SA. The electrodes RME of the sub-pixel PXn may be spaced apart from those of another sub-pixel PXn adjacent to the sub-pixel PXn in the first direction DR1 with respect to the second separation portion ROP2.

A first electrode RME1_7, a second electrode RME2_7, a third electrode RME3_7, and a fourth electrode RME4_7 may be sequentially arranged and spaced apart from one another in the second direction DR2. The first electrode RME1_7 may be disposed on a first sub-bank BNL_A1 and a second sub-bank BNL_B1 disposed on the left side of the first bank BNL1, and the second electrode RME2_7 may be disposed on a side of the first bank BNL1. The third electrode RME3_7 may be disposed on the opposite side of bank portions BP1 and BP2 of the first bank BNL1, and the fourth electrode RME4_7 may be disposed on a first sub-bank BNL_A2 and a second sub-bank BNL_B2 disposed on the right side of the first bank BNL1.

The light-emitting diodes ED may be sorted or divided into different light-emitting diodes ED, depending on whether the light-emitting diodes ED are disposed on a side between the first bank BNL1 and the second banks BNL2 and both sides thereof electrically contact the connection electrodes CNE. The first light-emitting diodes ED1 may be disposed between the first bank BNL1 and the first sub-bank BNL_A1 disposed on the left side of the first bank BNL1. Both sides of the first light-emitting diodes ED1 may be disposed on the first electrode RME1_7 and the second electrode RME2_7, and both sides may electrically contact a first connection electrode CNE1_7 and a third connection electrode CNE3_7, respectively. The second light-emitting diodes ED2 may be disposed between the first bank BNL1 and the first sub-bank BNL_A2 disposed on the right side of the first bank BNL1. Both sides of the second light-emitting diodes ED2 may be disposed on the third electrode RME3_7 and the fourth electrode RME4_7, respectively, and both sides may electrically contact a fourth connection electrode CNE4_7 and the third connection electrode CNE3_7, respectively.

The third light-emitting diodes ED3 may be disposed between the first bank BNL1 and the second sub-bank BNL_B1 disposed on the left side of the first bank BNL1. Both sides of the third light-emitting diodes ED3 may be disposed on the first electrode RME1_7 and the second electrode RME2_7, respectively, and both sides may electrically contact the fourth connection electrode CNE4_7 and a fifth connection electrode CNE5_7, respectively. The fourth light-emitting diodes ED4 may be disposed between the first bank BNL1 and the second sub-bank BNL_B2 disposed on the right side of the first bank BNL1. Both sides of the fourth light-emitting diodes ED4 may be disposed on the third electrode RME3_7 and the fourth electrode RME4_7, respectively, and both sides may electrically contact a second connection electrode CNE2_7 and the fifth connection electrode CNE5_7, respectively.

The first connection electrode CNE1_7 may be electrically connected to the first electrode RME1_7 through a first contact part CT1, and a second connection electrode CNE2_7 may be electrically connected to the third electrode RME3_7 through a second contact part CT2. On the other hand, the other connection electrodes CNE, for example, a third connection electrode CNE3_7, a fourth connection electrode CNE4_7, and a fifth connection electrode CNE5_7 may not electrically contact the other electrodes RME but may be electrically connected only to the light-emitting diodes ED. Accordingly, the second electrode RME2 and the fourth electrode RME4 may remain in a floating state without being electrically connected to the third conductive layer thereunder and the connection electrodes CNE.

The display device 10_7 may further include fifth light-emitting diodes ED5 having both sides not electrically contacting the connection electrodes CNE. Both sides of the fifth light-emitting diodes ED5 may be disposed on the first electrode RME1_7 and the second electrode RME2_7, or the third electrode RME3_7 and the fourth electrode RME4_7 and may be covered by the second insulating layer PAS2 and the third insulating layer PAS3. As described above, the arrangement of the connection electrodes CNE may be determined depending on the position of the pattern exposing both sides of the light-emitting diodes ED without the second insulating layer PAS2 and the third insulating layer PAS3. In order to connect serially the first light-emitting diodes ED1 and the second light-emitting diodes ED2 disposed on the upper side of the center of the emission area EMA with the third light-emitting diodes ED3 and the fourth light-emitting diode ED4 disposed on the lower side of the center of the emission area EMA and to separate them from each other, the second insulating layer PAS2 and the third insulating layer PAS3 may cover or overlap the first insulating layer PAS1 at the center of the emission area EMA.

However, since the electrodes RME are also disposed at the center of the emission area EMA, some of the light-emitting diodes ED may be disposed. Since both sides of such light-emitting diodes ED, for example, the fifth light-emitting diodes ED5, are covered by the second insulating layer PAS2 and the third insulating layer PAS3, they may not electrically contact the connection electrodes CNE. The display device 10_7 according to the embodiment may further include the fifth light-emitting diodes ED5 which are disposed in the emission area EMA but do not emit light with both sides not electrically contacting the connection electrodes CNE.

In the display device 10_7 according to the embodiment, since the electrodes RME are not sorted or divided into different electrode groups, there is an advantage that a process of separating the electrode lines in the emission area EMA can be omitted.

Figure 20:
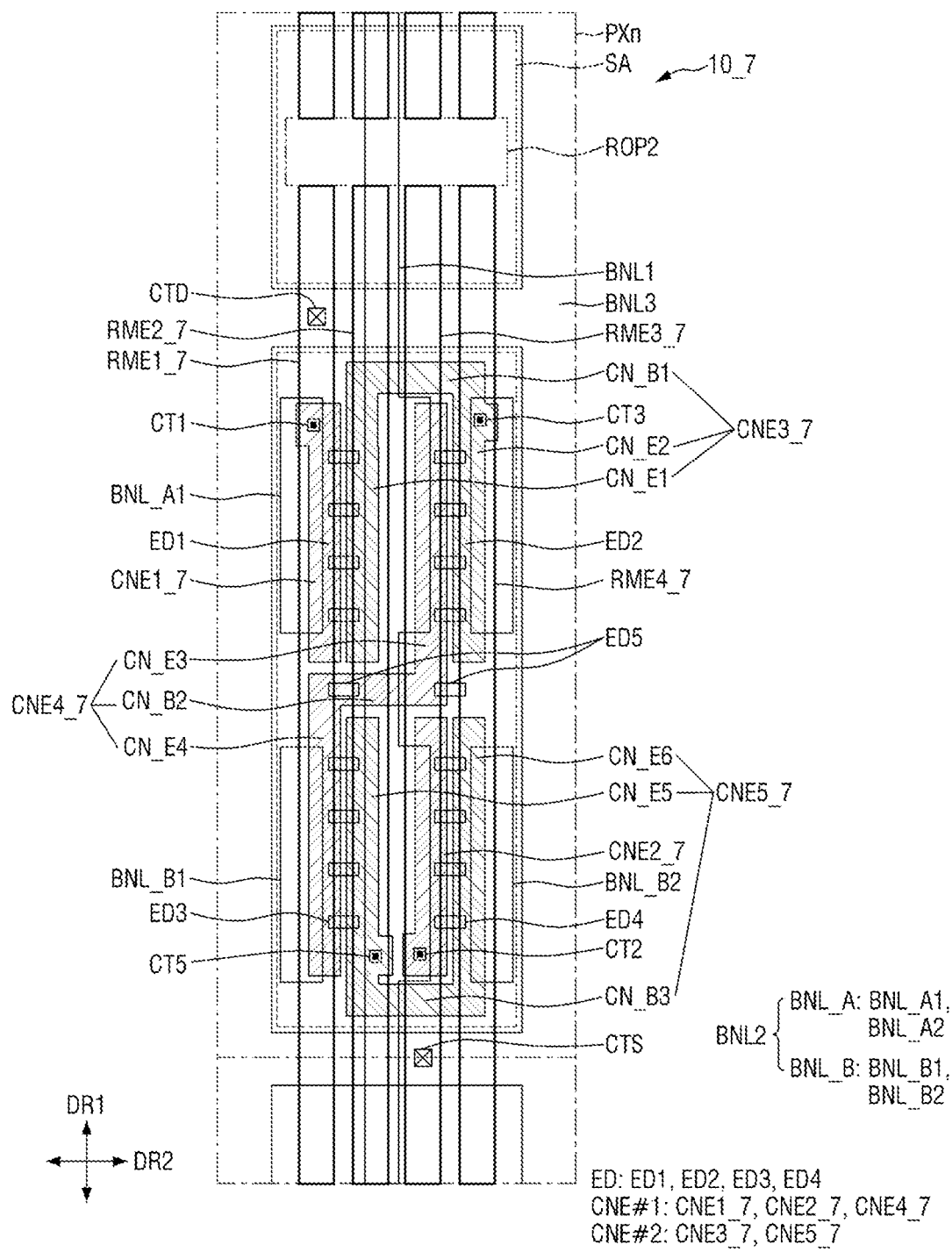
FIG. 20 is a schematic plan view showing another example of the display device of FIG. 18.

FIG. 20 is a schematic plan view illustrating an example of the display device of FIG. 18.

Referring to FIGS. 18 and 20, in a display device 10_7 according to an embodiment, electrodes RME1_7, RME2_7, RME3_7, and RME4_7 may not be separated in the emission area EMA and may be electrically connected with connection electrodes, respectively. In the display device 10_7 of FIG. 20, the second electrode RME2_7 and the fourth electrode RME4_7 may also be electrically connected to the fifth connection electrode CNE5_7 and the third connection electrode CNE3_7 and thus may not float.

The first electrode RME1_7 may be electrically connected to the first connection electrode CNE1_7 through the first contact part CT1, and the third electrode RME3_7 may be electrically connected to the second connection electrode CNE2_7 through the second contact part CT2. The second electrode RME2_7 may be electrically connected to the fifth connection electrode CNE5_7 through the fifth contact part CT5, and the fourth electrode RME4_7 may be electrically connected to the third connection electrode CNE3_7 through the third contact part CT3. Although the second electrode RME2_7 and the fourth electrode RME4_7 are electrically connected to different connection electrodes, (e.g., the third connection electrode CNE3_7 and the fifth connection electrode CNE5_7), respectively, the disclosure is not limited thereto. Since the third connection electrode CNE3_7 and the fifth connection electrode CNE5_7 may be disposed across the second electrode RME2_7 and the fourth electrode RME4_7, respectively, the second electrode RME2_7 and the fourth electrode RME4_7 may be together connected to one of the third connection electrode CNE3_7 and the fifth connection electrode CNE5_7.

For example, the third connection electrode CNE3_7 may be electrically connected to the second electrode RME2_7 and the fourth electrode RME4_7 through third contact parts CT3, and the fifth connection electrode CNE5_7 may not be electrically connected to the electrodes. Alternatively, the fifth connection electrode CNE5_7 may be electrically connected to the second electrode RME2_7 and the fourth electrode RME4_7 through fifth contact parts CT5, and the third connection electrode CNE3_7 may not have a connection structure with the electrodes.

In this embodiment, the first separation portion ROP1 may not be formed in each sub-pixel PXn, and the electrodes RME may not be separated from the other electrodes in the first direction DR1 while being electrically connected to each other through the connection electrodes CNE. In this manner, it is possible to prevent interference by electric signals applied to the underlying conductive layer or formation of parasitic capacitance with other electrodes by the electrodes remaining floating in each sub-pixel PXn.

Figure 21:
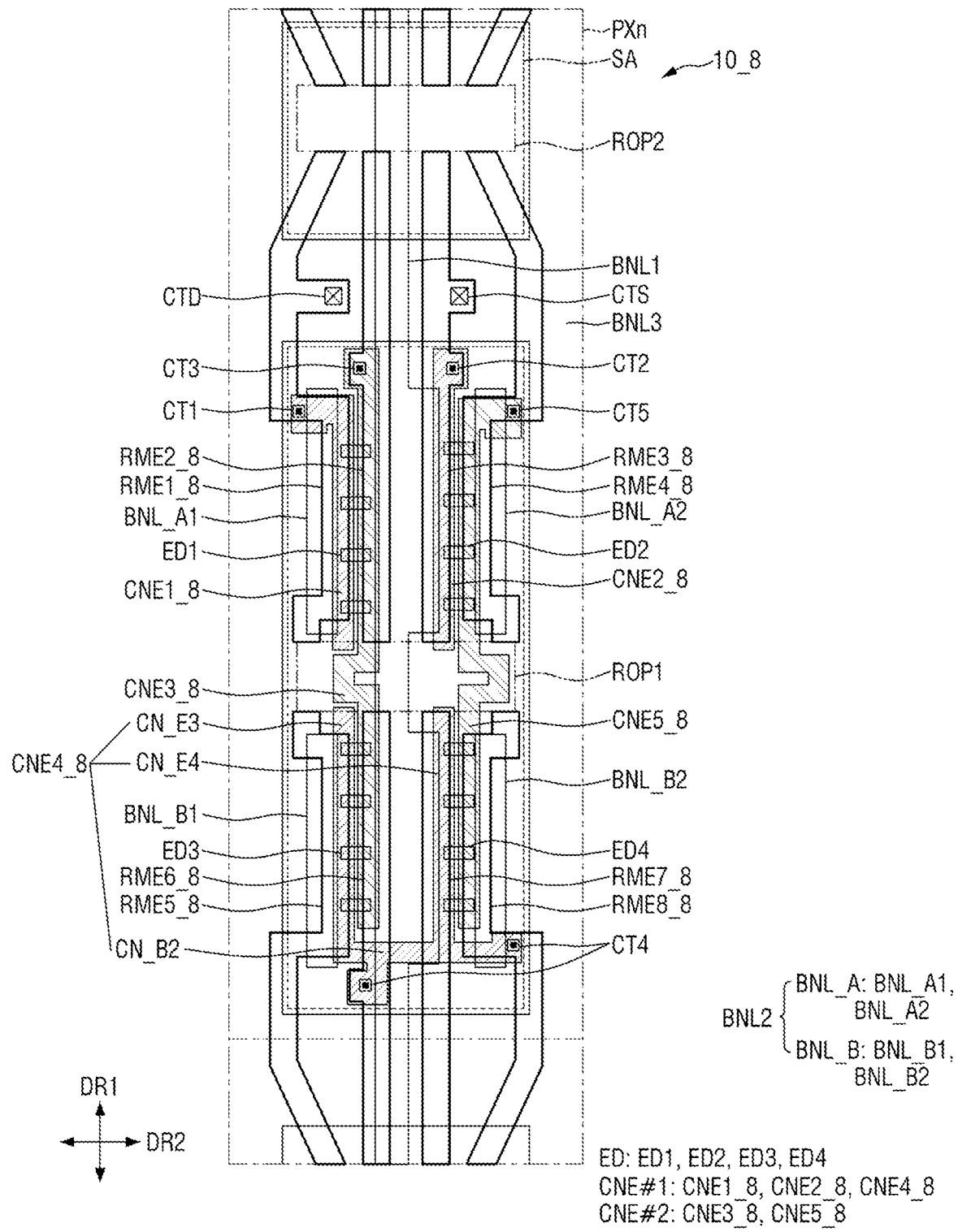
FIG. 21 is a schematic plan view showing a sub-pixel of a display device according to another embodiment of the disclosure.
Figure 22:
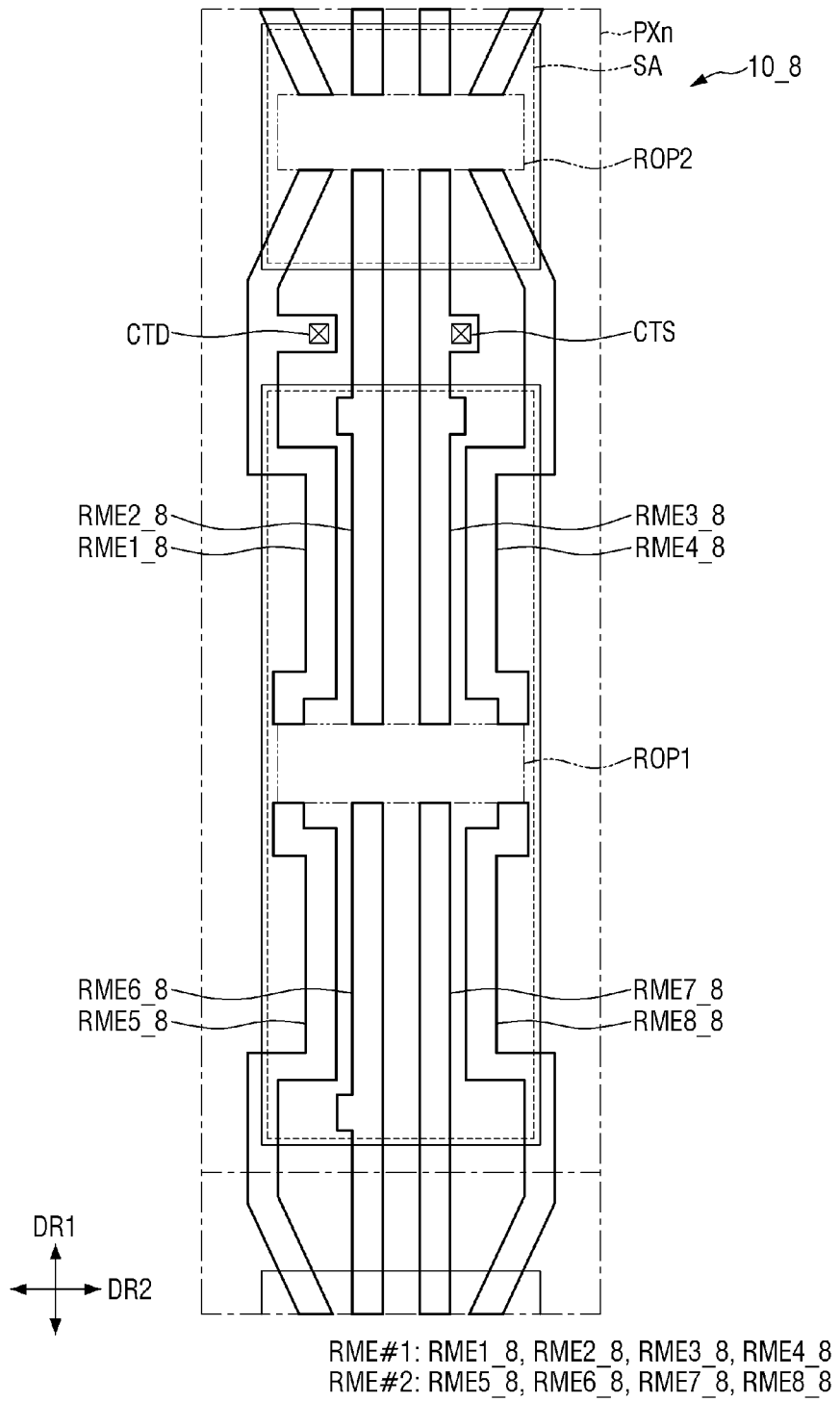
FIG. 22 is a schematic plan view showing an arrangement of electrodes disposed in a sub-pixel in the display device of FIG. 21.

FIG. 21 is a schematic plan view illustrating a sub-pixel of a display device according to an embodiment. FIG. 22 is a schematic plan view illustrating an arrangement of electrodes disposed in a sub-pixel in the display device of FIG. 21.

Referring to FIGS. 21 and 22, in a display device 10_8, electrodes RME may have partially bent shapes. As the electrodes RME have bent shapes, the distance between the electrodes RME and other electrodes RME spaced apart from the electrodes RME in the second direction DR2 may vary depending on the position thereof, and the light-emitting diodes ED may be concentrated at a specific position. The display device 10_8 according to this embodiment may be different from the display device according to the embodiment of FIG. 16 at least in that the electrodes RME have a different shape. Hereinafter, the shapes of the electrodes RME will be described in detail, and repetitive descriptions thereof will be omitted.

Among the electrodes RME, the electrodes closer to both sides of the emission area EMA in the second direction DR2, e.g., a first electrode RME1_8, a fourth electrode RME4_8, a fifth electrode RME5_8 and an eighth electrode RME8_8 may have partially bent shapes. On the other hand, a second electrode RME2_8, a third electrode RME3_8, a sixth electrode RME6_8, and a seventh electrode RME7_8 may have shapes extended in a direction.

The first electrode RME1_8 may be extended in the first direction DR1 and may include a part disposed on a first sub-bank BNL_A1 disposed on the left side of a first bank BNL1. The first electrode RME1_8 may further include a part extended in the first direction DR1 and parts electrically connected to it, bent in the second direction DR2, and bent again in the first direction DR1. For example, the first electrode RME1_8 may include a first electrode portion extended in the first direction DR1 and disposed on the first sub-bank BNL_A1, a second electrode portion electrically connected to the upper side of the first electrode portion and extended to a second separation portion ROP2 of the sub-area SA, and a third electrode portion electrically connected to the lower side of the first electrode portion and extended to a first separation portion ROP1 of the emission area EMA.

The first electrode portion of the first electrode RME1_8 may be spaced apart from and face the second electrode RME2_8 in the second direction DR2. The second electrode portion may be extended to the second separation portion ROP2 of the sub-area SA beyond the part of the third bank BNL3 extended in the second direction DR2. The second electrode portion may have a shape that is bent from a side of the first electrode portion to the outside, which is a side in the second direction DR2, and is bent again in the first direction DR1. The second electrode portion of the first electrode RME1_8 may be electrically connected to the third conductive layer thereunder through a first electrode contact hole CTD. The third electrode portion may be disposed up to the first separation portion ROP1 of the emission area EMA. The third electrode portion may also have a shape that is bent from another side of the first electrode portion to the outside, which is a side in the second direction DR2, and is bent again in the first direction DR1. The different electrode portions of the first electrode RME1_8 may have different distances from the electrode adjacent thereto in the second direction DR2. The distance between the first electrode portion and another electrode RME may be smaller than the distance between the other electrode RME and the part of the second electrode portion or the third electrode portion extended in the first direction DR1. The electric field generated over the electrodes RME spaced apart from one another in the second direction DR2 may induce or guide the light-emitting diodes ED so that they are concentrated on the first electrode portion of the first electrode RME1_8.

The fourth electrode RME4_8 may have a structure symmetrical to that of the first electrode RME1_8 except a part of the second electrode portion of the first electrode RME1_8 that overlaps the first electrode contact hole CTD. The fourth electrode RME4_8 may have a structure symmetrical to that of the first electrode RME1_8 based on a virtual line extended in the first direction DR1. Similarly, the fifth electrode RME5_8 and the eighth electrode RME8_8 may also have structures symmetrical to those of the first electrode RME1_8 and the fourth electrode RME4_8, respectively, based on a virtual line extended in the second direction DR2. The fifth electrode RME5_8 may have a structure symmetrical to that of the first electrode RME1_8 except a part of the second electrode portion of the first electrode RME1_8 that overlaps the first electrode contact hole CTD.

The first electrode portion of each of the first electrode RME1_8, the fourth electrode RME4_8, the fifth electrode RME5_8, and the eighth electrode RME8_8 disposed on the second bank BNL2 may be disposed relatively adjacent to the other electrodes RME spaced apart therefrom in the second direction DR2. The electric field generated over the electrodes RME spaced apart from one another in the second direction DR2 may be relatively strong on the first electrode portion of each of the first electrode RME1_8, the fourth electrode RME4_8, the fifth electrode RME5_8, and the eighth electrode RME8_8. Therefore, a side of each of the light-emitting diodes ED may be disposed on the first electrode portion. In particular, the third electrode portion of each of the first electrode RME1_8, the fourth electrode RME4_8, the fifth electrode RME5_8, and the eighth electrode RME8_8 may have a greater distance from the other electrodes RME spaced apart therefrom in the second direction DR2. The third electrode portion may be adjacent to the first separation portion ROP1 in which the electrodes RME are separated from each other, and the light-emitting diodes ED may be hardly disposed. Accordingly, it is possible to prevent the light-emitting diodes ED disposed in the first separation portion ROP1 from being moved to another position and remain as foreign material during a process of separating the electrodes from each other in the first separation portion ROP1.

Each of a third connection electrode CNE3_8 and a fifth connection electrode CNE5_8 may extend in the first direction DR1 and may further include a part that is bent in the second direction DR2 to correspond to the third electrode portion of some electrodes RME. Each of the third connection electrode CNE3_8 and the fifth connection electrode CNE5_8 may have a general shape extended in the first direction DR1 and may include a bent part that protrudes toward one side or the opposite side in the second direction DR2 from the central portion of the emission area EMA. It is, however, to be understood that the disclosure is not limited thereto. The third connection electrode CNE3_8 and the fifth connection electrode CNE5_8 may have a shape extended in a direction as in the embodiment of FIG. 15.

The first, second, and fourth connection electrodes CNE1_8, CNE2_8, and CNE4_8 and those of other above-described embodiments may have substantially same or similar structures and/or functions or different structures and/or functions within the sprit and scope of the disclosure.

In concluding the detailed description, those skilled in the art will appreciate that many variations and modifications can be made to the embodiments without substantially departing from the principles of the disclosure. Therefore, the disclosed embodiments of the disclosure are used in a generic and descriptive sense only and not for purposes of limitation.

What is claimed is:

1. A display device comprising:
   a first electrode group comprising a plurality of electrodes extended in a first direction and spaced apart from one another in a second direction crossing the first direction;
   a second electrode group spaced apart from the first electrode group in the first direction and comprising a plurality of electrodes;
   a plurality of light-emitting elements disposed on the plurality of electrodes of the first and second electrode groups spaced apart from one another in the second direction and having a shape extended in the second direction; and
   a plurality of connection electrodes disposed on at least some of the plurality of electrodes of the first and second electrode groups, electrically contacting the plurality of light-emitting elements, and spaced apart from one another in the second direction, wherein
   the plurality of connection electrodes comprise:
      a first connection electrode disposed on one of the plurality of electrodes of the first electrode group;
      a second connection electrode disposed on one of the plurality of electrodes of the second electrode group;
      a third connection electrode disposed on one or more of the plurality of electrodes of the first electrode group;

a fourth connection electrode disposed on another one of the plurality of electrodes of the first electrode group and on another one of the plurality of electrodes of the second electrode group; and
a fifth connection electrode disposed on one or more of plurality of the electrodes of the second electrode group,
the first connection electrode is spaced apart from a part of the fourth connection electrode on the second electrode group in the first direction, and
the second connection electrode is spaced apart from another part of the fourth connection electrode disposed on the first electrode group in the first direction.

2. The display device of claim 1, wherein parts of the third connection electrode disposed on the plurality of electrodes of the first electrode group are spaced apart from parts of the fifth connection electrode disposed on the plurality of electrodes of the second electrode group in the first direction, respectively.

3. The display device of claim 2, wherein
the first connection electrode electrically contacts the one of the plurality of electrodes of the first electrode group, and
the second connection electrode electrically contacts the one of the plurality of electrodes of the second electrode group.

4. The display device of claim 2, wherein
the first electrode group comprises:
   a first electrode;
   a second electrode spaced apart from the first electrode in the second direction;
   a third electrode spaced apart from the second electrode in the second direction; and
   a fourth electrode spaced apart from the third electrode in the second direction,
the second electrode group comprises:
   a fifth electrode spaced apart from the first electrode in the first direction;
   a sixth electrode spaced apart from the second electrode in the first direction;
   a seventh electrode spaced apart from the third electrode in the first direction; and
   an eighth electrode spaced apart from the fourth electrode in the first direction, and
the plurality of light-emitting elements comprise:
   a first light-emitting element disposed on the first electrode and the second electrode;
   a second light-emitting element disposed on the third electrode and the fourth electrode;
   a third light-emitting element disposed on the fifth electrode and the sixth electrode; and
   a third light-emitting element disposed on the seventh electrode and the eighth electrode.

5. The display device of claim 4, wherein
the first connection electrode is disposed on the first electrode,
the second connection electrode is disposed on the seventh electrode,
the third connection electrode comprises:
   a first extended portion disposed on the second electrode;
   a second extended portion disposed on the fourth electrode; and
   a first bridge portion electrically connecting the first extended portion with the second extended portion,
the fourth connection electrode comprises:
   a third extended portion disposed on the third electrode;
   a fourth extended portion disposed on the fifth electrode; and
   a second bridge portion electrically connecting the third extended portion with the fourth extended portion, and
the fifth connection electrode comprises:
   a fifth extended portion disposed on the sixth electrode;
   a sixth extended portion disposed on the eighth electrode; and
   a third bridge portion electrically connecting the fifth extended portion with the sixth extended portion.

6. The display device of claim 5, wherein
each of the first connection electrode, the second connection electrode, and the fourth connection electrode electrically contacts a first side of the plurality of light-emitting elements in the second direction, and
each of the third connection electrode and the fifth connection electrode electrically contacts a second side of the plurality of light-emitting elements in the second direction.

7. The display device of claim 5, wherein
each of the plurality of light-emitting elements comprises:
   a first semiconductor layer disposed at a first end of each of the plurality of light-emitting elements;
   a second semiconductor layer disposed at a second end of each of the plurality of light-emitting elements; and
   an emission layer between the first semiconductor layer and the second semiconductor layer,
the first light-emitting element and the third light-emitting element are oriented so that the first ends of the first and third light-emitting elements face in the second direction, and
the second light-emitting element and the fourth light-emitting element are oriented so that the first ends of the second and fourth light-emitting elements face in a direction opposite to the second direction.

8. The display device of claim 5, wherein
the second bridge portion and the third bridge portion are spaced apart from each other in a first separation portion between the first electrode group and the second electrode group, and
the first bridge portion is spaced apart from the first separation portion in the first direction.

9. The display device of claim 4, wherein
the first connection electrode is disposed on the second electrode,
the second connection electrode is disposed on the eighth electrode,
the third connection electrode comprises:
   a first extended portion disposed on the first electrode;
   a second extended portion disposed on the third electrode; and
   a first bridge portion electrically connecting the first extended portion with the second extended portion,
the fourth connection electrode comprises:
   a third extended portion disposed on the fourth electrode;
   a fourth extended portion disposed on the sixth electrode; and
   a second bridge portion electrically connecting the third extended portion with the fourth extended portion, and
the fifth connection electrode comprises:
   a fifth extended portion disposed on the fifth electrode;
   a sixth extended portion disposed on the seventh electrode; and a third bridge portion electrically connecting the fifth extended portion with the sixth extended portion.

10. The display device of claim 9, wherein
each of the first connection electrode, the second connection electrode, and the fourth connection electrode electrically contacts a second side of the plurality of light-emitting elements in the second direction, and
each of the third connection electrode and the fifth connection electrode electrically contacts a first side of the plurality of light-emitting elements in the second direction.

11. The display device of claim 9, wherein
each of the plurality of light-emitting elements comprises:
a first semiconductor layer disposed at a first end of each of the plurality of light-emitting elements;
a second semiconductor layer disposed at a second end of each of the plurality of light-emitting elements; and
an emission layer disposed between the first semiconductor layer and the second semiconductor layer,
the first light-emitting element and the third light-emitting element are oriented so that the first ends of the first and third light-emitting elements face in a direction opposite to the second direction, and
the second light-emitting element and the fourth light-emitting element are oriented so that the first ends of the second and fourth light-emitting elements face in the second direction.

12. The display device of claim 9, wherein
the first bridge portion and the second bridge portion are spaced apart from each other in a first separation portion between the first electrode group and the second electrode group, and
the third bridge portion is spaced apart from the first separation portion in the first direction.

13. The display device of claim 1, further comprising:
a first insulating layer disposed on the plurality of electrodes of the first and second electrode groups;
a second insulating layer disposed on the plurality of light-emitting elements and exposing a first side and a second side of each of the plurality of light-emitting elements in the second direction; and
a third insulating layer disposed on the second insulating layer and exposing the first side of each of the plurality of light-emitting elements,
wherein the plurality of light-emitting elements are disposed between the first insulating layer and the second insulating layer.

14. The display device of claim 13, wherein
the first connection electrode, the second connection electrode, and the fourth connection electrode are disposed on the third insulating layer and electrically contact the first side of each of the plurality of light-emitting elements,
the third connection electrode and the fifth connection electrode are disposed on the second insulating layer and electrically contact the second side of each of the plurality of light-emitting elements, and
the third insulating layer overlaps the third connection electrode and the fifth connection electrode.

15. A display device comprising:
a first electrode group comprising a plurality of electrodes including:
a first electrode extended in a first direction;
a second electrode spaced apart from the first electrode in a second direction;
a third electrode spaced apart from the second electrode in the second direction; and
a fourth electrode spaced apart from the third electrode in the second direction;
a second electrode group comprising:
a fifth electrode spaced apart from the first electrode in the first direction;
the sixth electrode spaced apart from the second electrode in the first direction;
a seventh electrode spaced apart from the third electrode in the first direction; and
an eighth electrode spaced apart from the fourth electrode in the first direction;
a plurality of light-emitting elements disposed on the plurality of electrodes spaced apart from one another in the second direction and extended in the second direction; and
a plurality of connection electrodes disposed on at least some of the plurality of electrodes, electrically contacting the plurality of light-emitting elements, and spaced apart from one another in the second direction,
wherein the plurality of connection electrodes comprises:
a first connection electrode disposed on the first electrode;
a second connection electrode disposed on the third electrode;
a third connection electrode disposed on the second electrode and the sixth electrode; and
a fourth connection electrode disposed on the fifth electrode and the seventh electrode; and
a fifth connection electrode disposed on the fourth electrode and the eighth electrode.

16. The display device of claim 15, wherein
each of the first connection electrode, the second connection electrode, and the fourth connection electrode electrically contacts a first side of the plurality of light-emitting elements in the second direction, and
each of the third connection electrode and the fifth connection electrode electrically contacts an opposite side of the plurality of light-emitting elements in the second direction.

17. The display device of claim 16, wherein
the fourth connection electrode comprises:
a plurality of extended portions disposed on the fifth electrode and the seventh electrode; and
a bridge portion extended in the second direction and electrically connecting the plurality of extended portions, and
the extended portions are disposed parallel to the first connection electrode and the second connection electrode in the first direction.

18. The display device of claim 16, wherein
each of the plurality of light-emitting elements comprises:
a first semiconductor layer disposed at a first end of each of the plurality of light-emitting elements;
a second semiconductor layer disposed at a second end of each of the plurality of light-emitting elements; and
an emission layer disposed between the first semiconductor layer and the second semiconductor layer, and
the plurality of light-emitting elements comprise:
a first type light-emitting element including a first end electrically contacting the first connection electrode and a second end electrically contacting the third connection electrode; and
a second type light-emitting element including a first end electrically contacting the third connection electrode and a second end electrically contacting the first connection electrode.

19. The display device of claim 15, further comprising:
a first insulating layer disposed on the plurality of electrodes;
a second insulating layer disposed on the plurality of light-emitting elements and exposing a first side and a second side of each of the plurality of light-emitting elements in the second direction; and
a third insulating layer disposed on the second insulating layer and exposing the first side of each of the plurality of light-emitting elements in the second direction, wherein
the first connection electrode, the second connection electrode, and the fourth connection electrode are disposed on the third insulating layer and electrically contact the first side of each of the plurality of light-emitting elements,
the third connection electrode and the fifth connection electrode are disposed on the second insulating layer and electrically contact the second side of each of the plurality of light-emitting elements, and
the third insulating layer overlaps the third connection electrode and the fifth connection electrode.

20. The display device of claim 19, wherein
the first connection electrode electrically contacts the first electrode through a first contact part penetrating through the first insulating layer, and
the second connection electrode electrically contacts the third electrode through a second contact part penetrating through the first insulating layer.

* * * * *